United States Patent
Barmon et al.

(10) Patent No.: US 12,334,138 B2
(45) Date of Patent: Jun. 17, 2025

(54) DYNAMIC ADDRESS SCRAMBLE

(71) Applicant: Micron Technology, Inc., Boise, ID (US)

(72) Inventors: Erik T. Barmon, Boise, ID (US); Yang Lu, Boise, ID (US); Nathaniel J. Meier, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 17/823,450

(22) Filed: Aug. 30, 2022

(65) Prior Publication Data

US 2024/0071464 A1 Feb. 29, 2024

(51) Int. Cl.
| | | |
|---|---|---|
| *G11C 11/408* | (2006.01) | |
| *G06F 12/06* | (2006.01) | |
| *G11C 7/24* | (2006.01) | |
| *G11C 29/18* | (2006.01) | |
| *G11C 29/56* | (2006.01) | |

(52) U.S. Cl.
CPC .......... *G11C 11/408* (2013.01); *G06F 12/06* (2013.01); *G11C 7/24* (2013.01); *G11C 29/18* (2013.01); *G11C 29/56004* (2013.01)

(58) Field of Classification Search
CPC . G11C 11/408; G11C 29/18; G11C 29/56004; G11C 7/24; G06F 11/10; G06F 13/1657; G06F 13/4004; G06F 13/4022; G06F 13/4072; G06F 13/4217; G06F 13/4221; G06F 13/4234; G06F 12/1408; G06F 21/72; G06F 21/79; G06F 2212/1052; G06F 9/24; G06F 12/06
USPC .................................................. 711/202, 221
See application file for complete search history.

(56) References Cited

U.S. PATENT DOCUMENTS

| | | | |
|---|---|---|---|
| 10,895,901 B1 * | 1/2021 | Wang .................... | G06F 1/3253 |
| 11,158,369 B2 * | 10/2021 | Sharon .................... | G11C 8/16 |
| 2011/0035539 A1 * | 2/2011 | Honda ................. | G06F 11/1068 |
| | | | 711/E12.001 |
| 2012/0278687 A1 * | 11/2012 | Sharon ................ | G06F 11/1048 |
| | | | 714/790 |
| 2013/0201748 A1 * | 8/2013 | Chung ..................... | G11C 8/20 |
| | | | 365/100 |
| 2020/0159674 A1 * | 5/2020 | Morgan .............. | G06F 12/0238 |
| 2021/0089455 A1 * | 3/2021 | Berger .................. | G11C 5/144 |
| 2021/0134384 A1 * | 5/2021 | Ning ...................... | G11C 29/18 |
| 2022/0327276 A1 * | 10/2022 | Seshan .................. | G06F 13/382 |

* cited by examiner

*Primary Examiner* — Daniel C. Chappell
*Assistant Examiner* — Edward Waddy, Jr.
(74) *Attorney, Agent, or Firm* — Colby Nipper PLLC

(57) ABSTRACT

Described apparatuses and methods enable a system including at least one memory device to load different address scramble patterns on dies of the memory device. The address scramble patterns may include the logical-to-physical conversion of rows in the memory device or the memory dies. In aspects, the apparatuses and methods can change the address scrambles at different intervals, such as after a power reset or when the data stored on the memory device is invalid, not current, flushable, or erasable. The described aspects may reduce effectiveness of usage-based disturb attacks used by malicious actors to discover a layout of a type of particular memory device or memory die.

42 Claims, 11 Drawing Sheets

DYNAMIC ADDRESS SCRAMBLE

BACKGROUND

Computers, smartphones, and other electronic devices operate using processors and memories. A processor executes code based on data to run applications and provide features to a user. The processor obtains the code and the data from a memory that can store information. As a result, like a processor's speed or number of cores, a memory's type or other characteristics can impact the performance of an electronic device. Different types of memory may have different characteristics. Memory types include volatile memory and nonvolatile memory, such as random access memory (RAM) and flash memory, respectively. RAM can include static RAM (SRAM) and dynamic RAM (DRAM), such as Compute Express Link™ (CXL) attached memory. Flash memory can be used to build, for instance, a solid-state drive (SSD).

Demands on the different types of memory continue to evolve and grow. For example, as processors are engineered to execute code faster, such processors can benefit from accessing memories more quickly. Applications may also operate on ever-larger data sets that occupy ever-larger memories. Due to battery-powered electronic devices and power-hungry data centers, energy-usage constraints are becoming more prevalent for memory systems. Further, manufacturers may seek physically smaller memories as the form factors of portable electronic devices continue to shrink. Accommodating these various demands is complicated by the diverse strengths and capabilities of different types of memories.

BRIEF DESCRIPTION OF THE DRAWINGS

Apparatuses of and techniques for dynamic address scramble are described with reference to the following drawings. The same numbers are used throughout the drawings to reference like features and components.

DETAILED DESCRIPTION

Overview

Figure 1:
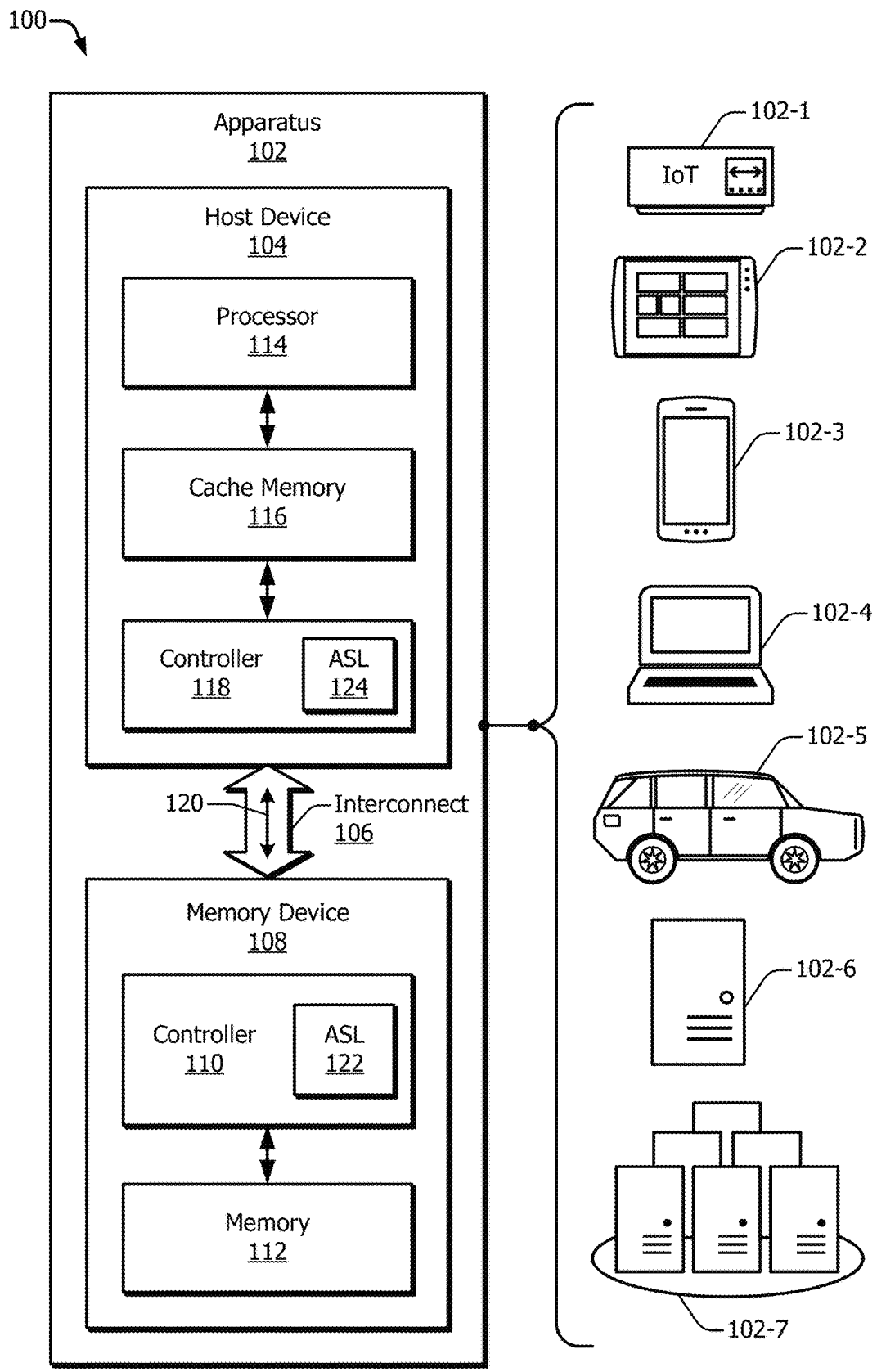
FIG. 1 illustrates example apparatuses that can implement aspects of dynamic address scramble.

Processors and memory work in tandem to provide features to users of computers and other electronic devices. Generally, an electronic device can provide enhanced features, such as high-resolution graphics or artificial intelligence, as a processor and memory operate more quickly together in a complementary manner. Some applications, like those for artificial intelligence (AI) analysis and virtual-reality graphics, can also demand increasing amounts of memory. Such applications use increasing amounts of memory to more accurately model and mimic human thinking and the physical world.

Processors and memories can be secured to a printed-circuit board (PCB), such as a rigid or flexible motherboard. The PCB can include sockets for accepting at least one processor and one or more memories. Wiring infrastructure that enables communication between two or more components can also be disposed on at least one layer of the PCB. This PCB, however, provides a finite area for the sockets and the wiring infrastructure. Some PCBs include multiple sockets that are each shaped as a linear slot and designed to accept a double-inline memory module (DIMM). These sockets can be fully occupied by DIMMs while a processor is still able to utilize more memory. In such situations, the system is capable of performing better if additional memory were available to the processor.

Printed circuit boards may also include at least one peripheral component interconnect (PCI) express (PCI Express®) (PCIe or PCI-E) slot. A PCIe slot is designed to provide a common interface for various types of components that may be coupled to a PCB. Compared to some older standards, PCIe can provide higher rates of data transfer or a smaller footprint on the PCB, including both greater speed and smaller size. Accordingly, certain PCBs enable a processor to access a memory device that is connected to the PCB via a PCIe slot.

In some cases, accessing a memory solely using a PCIe protocol may not offer as much functionality, flexibility, or reliability as is desired. In such cases, another protocol may be layered on top of the PCIe protocol. An example of another, higher-level protocol is the Compute Express Link™ (CXL) protocol. The CXL protocol can be implemented over a physical layer that is governed by the PCIe protocol. The CXL protocol can provide a memory-coherent interface that offers high-bandwidth or low-latency data transfers, including data transfers having both higher bandwidth and lower latency.

Various electronic devices, such as a mobile phone having a processor that is part of a system-on-chip (SoC) or a cloud-computing server having dozens of discrete processing units, may employ memory that is coupled to a processor via a CXL-based interconnect. For clarity, consider an apparatus with a host device that is coupled to a memory device via a CXL-based interconnect. The host device can include a processor and a controller (e.g., a host-side controller) that is coupled to the interconnect. The memory device can include another controller (e.g., a memory-side controller) that is coupled to the interconnect and one or more memory arrays to store information in SRAM, DRAM, flash memory, and so forth.

During operation, the host-side controller issues memory requests to the memory-side controller over the interconnect. The memory request may be or may include a read request or a write request. The memory-side controller receives the memory request via the interconnect and directly or indirectly uses the memory arrays to fulfill the memory request with a memory response. Thus, the memory-side controller sends the memory response to the host-side controller over the interconnect. To fulfill a read request, the memory-side controller returns the requested data with the memory response. As part of fulfilling a write request, the memory-side controller can provide notice that the write operation was successfully completed by transmitting an acknowledgment as the memory response (e.g., using a message such as a subordinate-to-master no-data response completion (S2M NDR Cmp) message).

To increase bandwidth and reduce latency, the memory-side controller can include at least one request queue that may accumulate multiple memory requests (e.g., multiple read requests or multiple write requests) received from the host-side controller. In other words, the host-side controller can send a "subsequent" memory request before receiving a memory response corresponding to a "previous" memory request. This can ensure that the memory device is not waiting idly for another memory request that the host-side controller has already prepared. This technique can also better utilize the interconnect by transmitting the subsequent memory request before the memory response for the previous memory request is ready.

In some electronic systems, memory devices in those systems may be attacked by malicious actors using various techniques, such as a usage-based disturb attack. Generally, usage-based disturb attack is a security attack that takes advantage of a weakness in physical layouts of memory designs, especially when rows of adjacent memory are close to one another (e.g., due to shrinking manufacturing process geometries). In current memory designs, the disturb threshold of memory devices has decreased to a size at which normal computer system programs may inadvertently corrupt their own data or the data of another program sharing the same memory devices.

To implement a usage-based disturb attack, a malicious actor repeatedly pre-charges a first row of memory, which causes a charge to leak to cells in an adjacent row of memory. If the malicious actor knows how the rows of memory are organized, they can identify a row adjacent to the one they want to attack. The malicious actor then attacks the adjacent row by disturbing that row to gain access to the desired row. For example, the malicious actor may want to gain access to a particular row of memory to read, corrupt, or change the contents of the row of memory.

To prevent a malicious actor from knowing the physical layout of rows in a memory device, such as a DRAM, the memory device uses an indirect mapping of the logical-to-physical conversion of the rows. However, the malicious actor may be able to determine the method of indirect mapping for the logical-to-physical conversion of the rows in a memory device by gaining access to a memory device. The malicious actor then tests their attack on the memory device based on mapping obtained from this previous access. For example, the malicious actor may pre-charge many (or all) rows in the memory device to determine the indirect logical-to-physical mapping method implemented by the memory device. Once this information is known, the malicious actor can attack similar memory devices implemented in various systems around the world to corrupt, read, or change the memory contents.

In contrast to these preceding techniques, this disclosure describes aspects of dynamic address scramble that can prevent malicious actors from determining an address mapping scheme for a memory device by implementing dynamic address scrambling for logical-to-physical mapping in the memory device. By using a dynamic address scramble, a malicious actor is prevented from discovering the address scramble and/or mapping scheme associated with a memory die by performing multiple attacks. As discussed herein, the address scramble associated with a memory device changes regularly, in some cases with different time-varying scramble patterns assigned to each die of the memory device. Thus, even if a malicious actor determines a portion of the address scramble associated with a particular memory device, that address scramble will soon change, which renders the malicious actor's initial discoveries obsolete and unusable for subsequent attacks.

As described in greater detail herein, the dynamic address scramble feature enhances system security by reducing or eliminating the effectiveness of usage-based disturb attacks. In example implementations, a memory controller may scramble the addresses on each memory device in a pattern that is unique to each memory die and may change these respective address scramble patterns over time. This approach can increase the difficulty for a malicious actor to determine the logical-to-physical relationship of the addresses between the system and the memory device. Additionally, this approach can decrease the effectiveness of a usage-based disturb attack by spreading disturb victim data cells to different codewords.

In example implementations, the described systems, configurations, and methods allow a memory controller to load or set a different address scramble pattern on each die of a memory device at different times or after different activities, such as after a power reset or during normal operation if the data stored on the memory device is invalid, not current, flushable, or erasable. This may prevent the malicious actor from discovering the layout of the particular memory die they attempt to attack multiple times. Further, any discoveries of memory die layout made through a usage-based disturb attack are rendered useless when the address scramble pattern of the die changes and is unique to that die, meaning the malicious actors cannot leverage the obtained layout information to attack other memory devices of the same type.

Example Operating Environments

Although particular examples discussed herein may refer to DRAM devices, the described systems and methods are applicable to any type of memory device, memory system, or computing system that contains any number of memory devices.

FIG. 1 illustrates, at 100 generally, example apparatuses 102 that can implement aspects of dynamic address scramble in accordance with one or more aspects. The apparatus 102 can be realized as, for example, at least one electronic device. Example electronic-device implementations include an internet-of-things (IoTs) device 102-1, a tablet device 102-2, a smartphone 102-3, a notebook computer 102-4 (or a desktop computer), a passenger vehicle 102-5 (or other vehicle), a server computer 102-6, a server cluster 102-7 that may be part of cloud computing infrastructure or a data center, and any portion thereof (e.g., a printed circuit board (PCB) or module component of a device).

Other examples of the apparatus 102 include a wearable device, such as a smartwatch or intelligent glasses; an entertainment device, such as a set-top box or streaming dongle, a smart television, a gaming device, or virtual reality (VR) goggles; a motherboard or blade of a server; a consumer appliance; a vehicle or drone, or the electronic components thereof; industrial equipment; a security or other sensor device; and so forth. Each type of electronic device or other apparatus can include one or more components to provide some computing functionality or feature that is enabled or enhanced by the hardware or techniques that are described herein.

In example implementations, the apparatus 102 can include at least one host device 104, at least one interconnect 106, and at least one memory device 108. The host device 104 can include at least one processor 114, at least one cache memory 116, and at least one controller 118 (e.g., memory controller). The memory device 108 may include at least one controller 110 (e.g., memory controller) and at least one memory 112. The memory 112 may be realized with one or more memory types. The memory controller 110 or the memory controller 118 may be implemented as memory control logic configured to enable access or other memory operations for one or more memories coupled to the memory control logic.

The memory 112 may be realized, for example, with a dynamic random-access memory (DRAM) die or module, including with a three-dimensional (3D) stacked DRAM device, such as a high bandwidth memory (HBM) device or a hybrid memory cube (HMC) device. DRAM may include, for instance, synchronous DRAM (SDRAM) or double data rate (DDR) DRAM (DDR DRAM). The memory 112 may also be realized using static random-access memory (SRAM). Thus, the memory device 108 may operate as a main memory, a backing memory, a cache memory, or the like. Additionally or alternatively, the memory device 108 may operate as storage memory. In such cases, the memory 112 may be realized, for example, with a storage-class memory type, such as one employing 3D XPoint™ or phase-change memory (PCM), flash memory, a magnetic hard disk, or a solid-state drive (e.g., a Non-Volatile Memory Express® (NVMe®) device).

Regarding the host device 104, the processor 114 can be coupled to the cache memory 116, and the cache memory 116 can be coupled to the controller 118. The processor 114 can also be coupled to the controller 118 directly or indirectly (e.g., via the cache memory 116 as depicted). The host device 104 may include other components to form, for instance, a system-on-a-chip or a system-on-chip (SoC). The processor 114 may include or comprise a general-purpose processor, a central processing unit (CPU), a graphics processing unit (GPU), a neural network engine or accelerator, an application-specific integrated circuit (ASIC), a field-programmable gate array (FPGA) integrated circuit (IC), a communication processor (e.g., a modem or baseband processor), an SoC, and so forth.

In operation, the controller 118 can provide a high-level or logical interface between the processor 114 and at least one memory device, such as a memory that is external to the host device 104. The controller 118 can, for example, receive memory requests from the processor 114 and provide the memory requests to an external memory with appropriate formatting, packaging, timing, reordering, and so forth. The controller 118 can forward to the processor 114 responses to the memory requests that the controller 118 receives from the external memory.

The controller 118 may communicate with multiple memory devices, or other types of devices—some of which may include one or more memory components, over one or more interconnects, such as the interconnect 106. Regarding connections that are external to the host device 104, the host device 104 can be coupled to the memory device 108 via the interconnect 106. The memory device 108 may be coupled to, or may include, a main memory or a storage memory, including both in some cases. Another device, such as a cache memory or a switch, may be coupled between the host device 104 and the memory device 108 and may be part of or separate from the interconnect 106.

The depicted interconnect 106, as well as other interconnects (not shown) that communicatively couple together various components, enables data to be transferred between two or more components of the various components. Interconnect examples include a bus, a switching fabric, a crossbar, one or more wires or conductive paths that carry voltage or current signals, and so forth. Each interconnect may be implemented as a unidirectional interconnect or a bidirectional interconnect. The interconnect 106 can be implemented as a parallel propagation pathway. For example, the interconnect 106 can include at least one command and address bus and at least one data bus, each of which carries multiple bits of a particular item of information (e.g., a data byte) simultaneously in each clock period. Alternatively, the interconnect 106 can be implemented as a serial propagation pathway that carries one bit of a particular item of information each clock cycle. For instance, the interconnect 106 can comport with a PCIe standard, such as version 4, 5, 6, or a future version. The interconnect 106 may include multiple serial propagation pathways, such as multiple lanes in a PCIe implementation.

The components of the apparatus 102 that are depicted in FIG. 1 represent an example computing architecture that may include a hierarchical memory system. A hierarchical memory system can include memories at different levels, with each level having a memory with a different speed, capacity, or volatile/nonvolatile characteristic. Thus, the memory device 108 may be described in terms of forming at least part of a main memory of the apparatus 102. The memory device 108 may, however, form at least part of a cache memory, a storage memory, an SoC, and so forth of an apparatus 102.

Although various implementations of the apparatus 102 are depicted in FIG. 1 and described herein, an apparatus 102 can be implemented in alternative manners. For example, the host device 104 may include multiple cache memories, including multiple levels of cache memory, or may omit a cache memory. A memory, such as the memory device 108, may have a respective "internal" or "local" cache memory (not shown). In some cases, the host device 104 may omit the processor 114 and/or include other logic. Generally, the illustrated and described components may be implemented in alternative ways, including in distributed or shared memory systems. A given apparatus 102 may also include more, fewer, or different components than those depicted in FIG. 1 or described herein.

The host device 104 and any of the various memories may be realized in multiple manners. In some cases, the host device 104 and the memory device 108 may be located on separate blades or racks in a server computing environment. In other cases, the host device 104 and the memory device 108 can both be disposed on, or physically supported by, a same printed circuit board (PCB) (e.g., a rigid or flexible motherboard or PCB assembly). The host device 104 and the memory device 108 may also be integrated on a same IC or fabricated on separate ICs but packaged together.

A memory device 108 may also be coupled to multiple host devices 104 via one or more interconnects 106 and may be able to respond to memory requests from two or more of the multiple host devices 104. Each host device 104 may include a respective controller 118, or the multiple host devices 104 may share a common controller 118. An example computing system architecture with at least one host device 104 that is coupled to a memory device 108 is described below with reference to FIG. 2.

With continuing reference to FIG. 1, however, the interconnect 106 may propagate one or more communications. The host device 104 and the memory device 108 may exchange at least one memory request/memory response 120. For example, the controller 118 may transmit a memory request to the controller 110 over the interconnect 106. Thus, the controller 110 may transmit a corresponding memory response to the controller 118 over the interconnect 106.

In aspects, the controller 110 of the memory device 108 can include an instance of address scramble logic 122 (ASL 122), and the controller 118 of the host device 104 can include another instance of address scramble logic 124 (ASL 124). In example implementations, the ASL 122 and/or the ASL 124 can facilitate various dynamic address scrambling operations or functions, as discussed throughout the disclosure.

In example implementations, the ASL 122 and/or the ASL 124 enable the memory controller 118 and/or the memory controller 110 to configure (e.g., load, set, change, etc.) a respective address scramble patterns for each die of a memory device. In aspects, the memory controller 118 and/or the memory controller 110 may configure the one or more of the respective address scramble patterns at different times, which may include after a power reset event, a power-on event, or during normal operation if the data stored on the memory device is no longer needed (e.g., invalid, not current, flushable, erasable, stale, etc.). For example, the memory controller 118 and/or the memory controller 110 may copy or move data (e.g., at a predefined time interval or in response to a die access threshold) from one memory die to another memory die, enabling the address scramble pattern on the former die to be changed. Alternatively or additionally, the memory controller 118 and/or the memory controller 110 may copy or move the data back to the memory die after changing the address scramble pattern. Example implementations are described further herein.

In some implementations, the apparatus 102 operates with one or more protocols over the interconnect 106. The apparatus 102 can operate, for example, a Compute Express Link™ (CXL) protocol across the interconnect 106. In at least some of these cases, the apparatus 102 can overlay the CXL protocol on top of a PCIe protocol for the physical layer. Thus, the controller 118 can comport with a CXL standard or a PCIe standard, including comporting with both. Similarly, the controller 110 can comport with a CXL standard or a PCIe standard, including with both. Examples of circuitry, techniques, and mechanisms are described below. Next, however, this document describes example computing architectures with one or more processors and a memory device.

Figure 2:
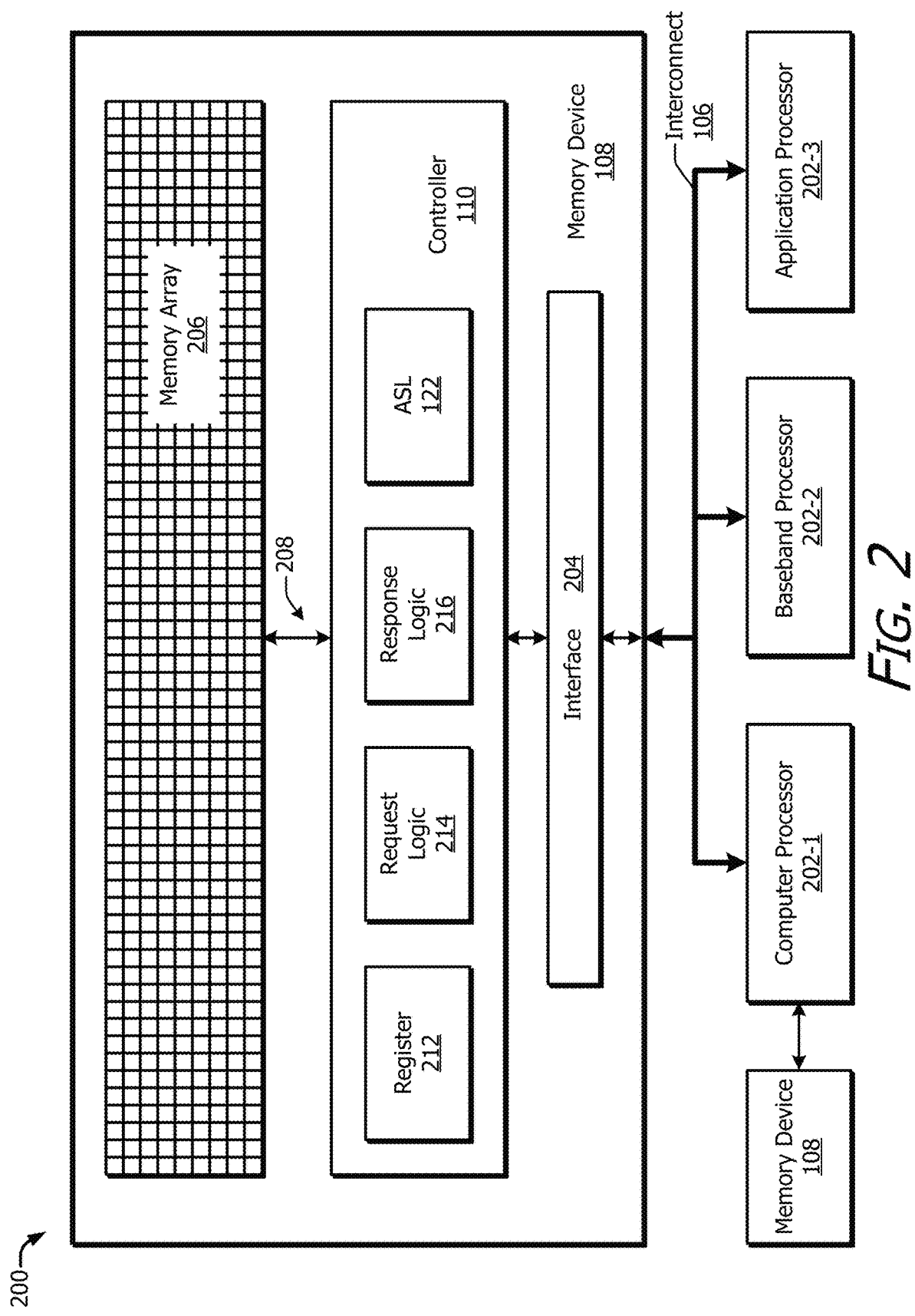
FIG. 2 illustrates an example computing system that can implement aspects of dynamic address scramble with a memory device.

FIG. 2 illustrates an example computing system 200 that can implement aspects of dynamic address scramble with a memory device. In some implementations, the computing system 200 includes at least one memory device 108, at least one interconnect 106, and at least one processor 202. The memory device 108 can include, or be associated with, at least one memory array 206, at least one interface 204 (e.g., host interface), and at least one controller 110. The at least one controller 110 can be communicatively coupled to the memory array 206 via at least one interconnect 208 (e.g., an "internal" interconnect, fabric, bus, etc.). The memory array 206 and the controller 110 may be components that are integrated on a single semiconductor die or that are located on separate semiconductor dies (e.g., but still coupled to or disposed on a same PCB or within a same semiconductor package). Each of the memory array 206 or the controller 110 may also be distributed across multiple dies (or dices).

The memory device 108 can correspond, for example, to one or more of a cache memory, main memory, or storage memory of the apparatus 102 of FIG. 1. Thus, the memory array 206 can include an array of memory cells implemented on one or more memory die. These memory cells can include, but are not limited to, memory cells of Static Random-Access Memory (SRAM), Dynamic Random-Access Memory (DRAM), Synchronous DRAM (SDRAM), three-dimensional (3D) stacked DRAM, Double Data Rate (DDR) memory, low-power Dynamic Random-Access Memory (DRAM), Low-Power Double Data Rate (LPDDR) Synchronous Dynamic Random-Access Memory (SDRAM), phase-change memory (PCM), or flash memory.

The controller 110 can include any one or more of a number of components that can be used by the memory device 108 to perform various operations. These operations can include communicating with other devices, managing performance, modulating memory access rates, implementing dynamic address scramble, and performing memory read or write operations. For example, the controller 110 can include at least one register 212 (e.g., control register), at least one instance of request logic 214, at least one instance of response logic 216, and at least one instance of ASL 122.

The register 212 may be implemented, for example, as one or more registers that can store information to be used by the controller 110, by another part of the memory device 108, or by a part of a host device 104, such as a controller 118 as depicted in FIG. 1. In aspects, the register 212 may include or be implemented as part of a mode register (MR) of the memory device 108. The controller 110, controller 118, ASL 122, or ASL 124 may determine and transmit instructions to the register 212 (e.g., mode register) of the memory device 108 to configure and/or implement aspects of dynamic address scramble as described herein. These instructions can include one or more binary digits (bits) or a voltage level used to control logical operations of ASL 122 and associated logic of a memory device 108. In some cases, the instructions to the register 212 may include mode register write (MRW) commands used to control one or more settings (e.g., address scramble patterns) of the memory device 108.

For example, the controller 118 may issue or provide a command to the controller 110 or ASL 122 to set, configure, or change respective address scramble settings for one or more memory dies of the memory device. In some cases, the command includes an MRW command to set or change the address scramble settings of the memory device 108. In some aspects, at power-on or reset, the register 212 may load default values for address scramble settings, which may be static, dynamic, or randomized. The controller 118 may not include a complete mapping of the scramble address patterns, yet may be configured to set different register values that correspond to different address scramble patterns for the memory device 108, the memory dies of the device 108, and other memory devices of the system.

Generally, the controller 118 may set or change address scramble settings of the memory device 108 at any suitable time, such as at power-up or reset of the memory device 108, which may preclude the need to migrate data or handle new address and data mapping. Alternatively or additionally, the controller 118 may set or change the address scramble settings of the memory device 108 when data of the memory device is no longer needed, such as when the data is invalid, stale, flushable, erasable, migrated to another location, or so forth. In aspects, the controller 118 or another entity of the system may determine when and/or to initiate a change or update of the address scramble settings of the memory device 108. For example, the controller may include a timer and at least one time threshold (e.g., randomized threshold for each die) configured to trigger a change to address scramble settings of the memory device 108. In other cases, the controller 118 or controller 110 may be configured to change or update the address scramble settings based on access activity of the memory device 108, such as based on a threshold a number of access operations (e.g., a number of writes) or amount of data accessed (e.g., a number of MBs read and/or written).

With reference to MRW commands useful to implement dynamic address scramble, any suitable MR register may be configured to enable control or interface with ASL 122 and/or controller 110 of the memory device 108. In some implementations, at least a portion of MR127 may be configured or reserved for implementing aspects of dynamic address scramble. For example, a memory device 108 can be configured such that bits 7:3 of MR127 (MR127<7:3>) enable and configuration of dynamic address scramble. In some cases, one bit of the MR (e.g., MR127[7]) may be allocated as an enable/disable bit for address scrambling. Other bits of the MR (e.g., MR127<6:3>) may be allocated for use, control, or configuration of options and settings to implement the address scrambling for the memory device. For example, any suitable number of bits (e.g., four or more bits) may be allocated to set, adjust, and/or configure options that relate to scrambling row addresses of the memory device 108. In some implementations, four bits of the register 212 enable 16 options for scrambling the row addresses of the memory device, and each option may shift the incoming row address left equal to an option number. Alternatively or additionally, the controller 110 or ASL 122 may load a default or predefined value to the MR on power-up or a rest toggle, such as loading a default value to MR127<7:3> from the fzRowScramble<4:0> (e.g., a memory device ROM location). In some cases, a memory manufacturer or integrator may set or program (e.g., program one-time programmable memory, burn fuses, set anti-fuses, or the like) different values of default values (e.g., fzRowScramble<4:0>) across memory components (e.g., DRAM devices) to implement a level of default address scramble protection for a system.

With reference to the controller 110 of the memory device, in various implementations, the controller 110 may include one or more counters, timers, or the like. The request logic 214 can process one or more memory requests, such as by formulating a request, directing a request to a next or final destination, or performing a memory access operation (e.g., a read or a write operation). The response logic 216 can prepare at least one memory response, such as by obtaining requested data or generating a write acknowledgement. The ASL 122 can facilitate dynamic address scrambling operations or functions, as discussed herein. Although depicted separately, the components of the controller 110 may be nested with respect to each other, may be at least partially overlapping with another component, and so forth.

The interface 204 can couple the controller 110 or the memory array 206 directly or indirectly to the interconnect 106. As shown in FIG. 2, the register 212, the request logic 214, the response logic 216, and the ASL 122 can be part of a single component (e.g., the controller 110). In other implementations, one or more of the register 212, the request logic 214, the response logic 216, or the ASL 122 may be implemented as separate components, which can be provided on a single semiconductor die or disposed across multiple semiconductor dies. These components of the controller 110 may be individually or jointly coupled to the interconnect 106 via the interface 204.

The interconnect 106 may be implemented with any one or more of a variety of interconnects that communicatively couple together various components and enable commands, addresses, messages, packets, and/or other information and data to be transferred between two or more of the various components (e.g., between the memory device 108 and any of the one or more processors 202). The information and data may be propagated over the interconnect 106 "directly" or using some form of encapsulation or packaging, such as with packets, frames, or flits. Although the interconnect 106 is represented with a single line or arrow in FIG. 2, the interconnect 106 may include at least one bus, at least one switching fabric, at least one crossbar, one or more wires or traces that carry voltage or current signals, at least one switch, one or more buffers, at least one lane, and so forth.

In some aspects, the memory device 108 may be realized as a "separate" physical component relative to the host device 104 (of FIG. 1) or any of the processors 202. Examples of physical components that may be separate include, but are not limited to, a printed circuit board (PCB), which can be rigid or flexible; a memory card; a memory stick; and a memory module, including a single in-line memory module (SIMM), a dual in-line memory module (DIMM), packages on package (PoP), or a non-volatile memory express (NVMe) module. Thus, separate physical components may be located together within a same housing of an electronic device or a memory product, or such physical components may be distributed over a server rack, a data center, and so forth. Alternatively, the memory device 108 may be packaged or integrated with other physical components, including a host device 104 or a processor 202, such as by being disposed on a common PCB, combined together in a single device package, or integrated into an SoC of an apparatus.

As shown in FIG. 2, the one or more processors 202 of the system may include a computer processor 202-1, a baseband processor 202-2, and an application processor 202-3, which are coupled to the memory device 108 through the interconnect 106. The processors 202 may each be, or may form a part of, a CPU, a GPU, an SoC, an ASIC, an FPGA, or the like. In some cases, a single "processor" can comprise multiple processing cores or resources, each dedicated to different functions, such as modem management, applications, graphics, central processing, neural network acceleration, or the like. In some implementations, the baseband processor 202-2 may include or be coupled to a modem (not shown in FIG. 2) and may be referred to as a modem processor. The modem and/or the baseband processor 202-2 may be coupled wirelessly to a network via, for example, cellular, Wi-Fi®, Bluetooth®, ultra-wideband (UWB), near field, or another technology or protocol for wireless communication.

In various implementations, the processors 202 may be connected to different memories in different manners. For example, the processors 202 may be connected directly to the memory device 108 (e.g., via the interconnect 106 as shown). Alternatively, one or more of the processors 202 may be indirectly connected to the memory device 108, such as over a network connection, through one or more other devices or components, and/or using at least one other additional interconnect. Each processor 202 may be realized similarly to the processor 114 of FIG. 1. Accordingly, a respective processor 202 can include or be associated with a respective controller, like the controller 118 depicted in FIG. 1. Alternatively, two or more processors 202 may access the memory device 108 using a shared or system controller 118. In any of such cases, the controller 118 may include ASL 122 (e.g., of FIG. 1) to implement aspects of dynamic memory scramble as described herein. Each processor 202 may also be separately connected to a respective memory. As shown, the computer processor 202-1 may be coupled to at least one memory device 108 that is not shared, which may be separate from the system, integrated with the system, and/or coupled to a package or mainboard or the system. The memory device 108 may be any type of memory device, such as a DIMM. The memory device 108 can be coupled to a memory controller (not shown), which may be part of the computer processor 202-1.

The apparatuses and methods that are described herein may be appropriate for memory that is designed for use with a PCIe bus. Thus, the described principles may be incorporated into a memory device with a PCIe interface. Further, the memory device can communicate over the interconnect 106 by overlaying a CXL protocol on the physical PCIe interface. An example of a memory standard that relates to CXL is promulgated by the Compute Express Link™ consortium and may include versions 1.0, 1.1, 2.0, and future versions. Thus, the host device 104 or the memory device 108, including both in some cases, may comport with at least one CXL standard. Accordingly, some terminology in this document may draw from one or more of these standards or versions thereof for clarity. The described principles, however, are also applicable to memories that comport with other standards, including earlier versions or future versions of such standards, and to memories that do not adhere to a public standard. Examples of systems that may include a PCIe interface and a CXL protocol overlay are described next with reference to FIG. 3.

Figure 3:
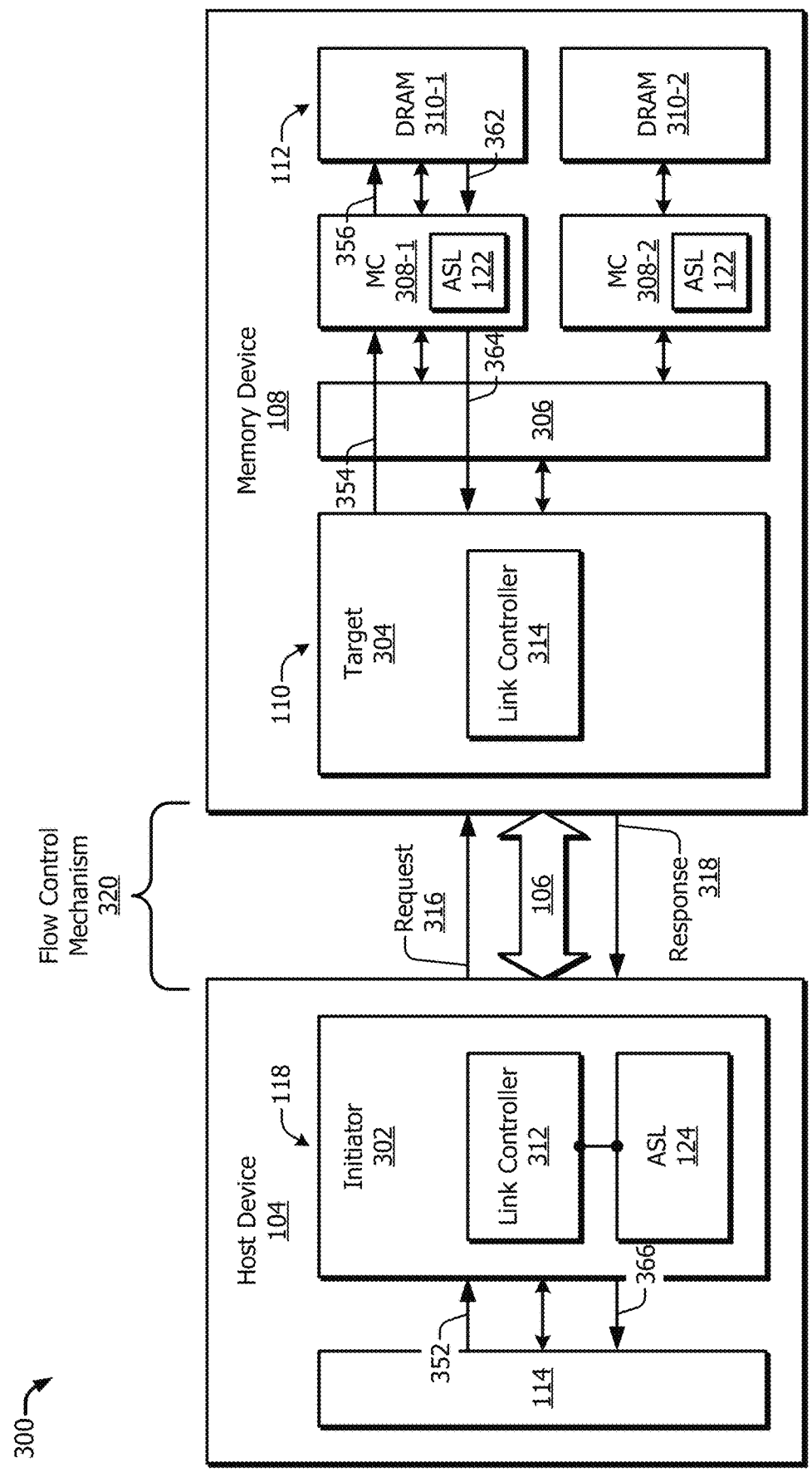
FIG. 3 illustrates an example of a system that includes a host device and a memory device that are capable of implementing aspects of dynamic address scramble.

FIG. 3 illustrates examples of a system 300 that can include a host device 104 and a memory device 108 that are capable of implementing aspects of dynamic address scramble. The host device 104 and a memory device 108 are coupled together via an interconnect 106, which may be implemented as described herein. The system 300 can implement aspects of dynamic address scramble and may form at least part of an apparatus 102 as shown in FIG. 1. As illustrated in FIG. 3, the host device 104 includes a processor 114 and a controller 118, which can be realized with at least one initiator 302. Thus, the initiator 302 can be coupled to the processor 114 or to the interconnect 106 (including to both), and the initiator 302 can be coupled between the processor 114 and the interconnect 106. Examples of initiators 302 may include a leader, a primary, a tenant, virtual machine, a master, a requester or requesting component, a main component, and so forth.

In the illustrated example system 300, the memory device 108 includes a controller 110, which can be realized with at least one target 304. The target 304 can be coupled to the interconnect 106. Thus, the target 304 and the initiator 302 can be coupled to each other via the interconnect 106. Examples of targets 304 may include a follower, a virtual function, a secondary, a slave, a subordinate, a responder or responding component, a subsidiary component, and so forth. The memory device 108 also includes a memory 112. The memory 112 can be realized with at least one memory module or chip or with a memory array 206 (of FIG. 2) or another component, such as a DRAM 310, as is described below.

In example implementations, the initiator 302 includes at least one link controller 312, and the target 304 includes at least one link controller 314. The link controller 312 or the link controller 314 can instigate, coordinate, cause, or otherwise participate in or control signaling across a physical or logical link realized by the interconnect 106 in accordance with one or more protocols. The link controller 312 may be coupled to the interconnect 106. The link controller 314 may also be coupled to the interconnect 106. Thus, the link controller 312 can be coupled to the link controller 314 via the interconnect 106. Each link controller 312 or 314 may, for instance, control communications over the interconnect 106 at a link layer or at one or more other layers of a given protocol. Communication signaling may include, for example, a request 316, a response 318, and so forth.

The memory device 108 may further include at least one interconnect 306 and at least one memory controller 308 (MC 308). Within the memory device 108, and relative to the target 304, the interconnect 306, the memory controller 308, and/or the DRAM 310 (or other memory component) may be referred to as a "backend" or "downstream" component or memory component of the memory device 108. In some cases, the interconnect 306 is internal to the memory device 108 and may operate the same as or differently from the interconnect 106 or like the interconnect 208.

Thus, the memory device 108 can include at least one memory component. As shown, the memory device 108 may include multiple memory controllers 308-1 and 308-2 and/or multiple DRAMs 310-1 and 310-2. Although two of each are shown, the memory device 108 may include one or more than two memory controllers and/or one or more than two DRAMs. For example, a memory device 108 may include 4 memory controllers and 16 DRAMs, such as 4 DRAMs per memory controller. The memory 112 or memory components of the memory device 108 are depicted as DRAM as an example only, for one or more of the memory components may be implemented as another type of memory. For instance, the memory components may include nonvolatile memory like flash or PCM. Alternatively, the memory components may include other types of volatile memory like SRAM. Thus, the memory device 108 may include a dynamic random-access memory (DRAM) array, a static random-access memory (SRAM) array, or a nonvolatile memory array. A memory device 108 may also include any combination of memory types.

In some examples, multiple memory controllers 308-1 and 308-2 may each include the ASL 122 of the type discussed herein. In other examples, the ASL 122 may be located in the target 304, as a separate component of the memory device 108, or integrated with any other components shown in FIG. 3.

In some cases, the memory device 108 may include the target 304, the interconnect 306, the at least one memory controller 308, and the at least one DRAM 310 within a single housing or other enclosure. The enclosure, however, may be omitted or may be merged with one for the host device 104, the system 300, or an apparatus 102 (of FIG. 1). In some cases, each of these components can be realized with a separate IC. In some of such cases, the interconnect 306 can be disposed on a PCB. Each of the target 304, the memory controller 308, and the DRAM 310 may be fabricated on at least one IC and packaged together or separately. The packaged IC(s) may be secured to or otherwise supported by the PCB (or PCB assembly) and may be directly or indirectly coupled to the interconnect 306. In other cases, the target 304 of the controller 110, the interconnect 306, and the one or more memory controllers 308 may be integrated together into one IC. In some of such cases, this IC may be coupled to a PCB, and one or more modules for the memory components may also be coupled to the same PCB, which can form a CXL memory device 108. This memory device 108 may be enclosed within a housing or may include such a housing. The components of the memory device 108 may, however, be fabricated, packaged, combined, and/or housed in other manners.

As illustrated in FIG. 3, the target 304, including the link controller 314 thereof, can be coupled to the interconnect 306. Each memory controller 308 of the multiple memory controllers 308-1 and 308-2 can also be coupled to the interconnect 306. Accordingly, the target 304 and each memory controller 308 of the multiple memory controllers 308-1 and 308-2 can communicate with each other via the interconnect 306. Each memory controller 308 is coupled to at least one DRAM 310. As shown, each respective memory controller 308 of the multiple memory controllers 308-1 and 308-2 is coupled to at least one respective DRAM 310 of the multiple DRAMs 310-1 and 310-2. Each memory controller 308 of the multiple memory controllers 308-1 and 308-2 may, however, be coupled to a respective set of multiple DRAMs or other memory components.

Each memory controller 308 can access at least one DRAM 310 by implementing one or more memory access protocols to facilitate reading or writing data based on at least one memory address. The memory controller 308 can increase bandwidth or reduce latency for the memory accessing based on a type of the memory or an organization of the memory components, such as the multiple DRAMs. The multiple memory controllers 308-1 and 308-2 and the multiple DRAMs 310-1 and 310-2 can be organized in many different manners. For example, each memory controller 308 can realize one or more memory channels for accessing the DRAMs. Further, the DRAMs can be manufactured to include one or more ranks, such as a single-rank or a dual-rank memory module. Each DRAM 310 (e.g., at least one DRAM IC chip) may also include multiple banks, such as 8 or 16 banks.

A forward path of the memory device 108 may include one or more memory request queues. A return path of the memory device 108 may include one or more memory response queues. These queues may be present in, for example, the controller 110, a memory controller 308, a memory array, such as the DRAM 310, and so forth. Examples of a forward path and a return path are described next as part of an accessing operation for the memory device 108.

This document now describes examples of the host device 104 accessing the memory device 108. The examples are described in terms of a general memory access (e.g., a memory request) which may include a memory read access (e.g., a memory read request for a data retrieval operation) or a memory write access (e.g., a memory write request for a data storage operation). The processor 114 can provide a memory access request 352 to the initiator 302. The memory access request 352 may be propagated over a bus or other interconnect that is internal to the host device 104. This memory access request 352 may be or may include a read request or a write request. The initiator 302, such as the link controller 312 thereof, can reformulate the memory access request 352 into a format that is suitable for the interconnect 106. This reformulation may be performed based on a physical protocol or a logical protocol (including both) applicable to the interconnect 106. Examples of such protocols are described below.

The initiator 302 can thus prepare a request 316 and transmit the request 316 over the interconnect 106 to the target 304. The target 304 receives the request 316 from the initiator 302 via the interconnect 106. The target 304, including the link controller 314 thereof, can process the request 316 to determine (e.g., extract, decode, or interpret) the memory access request. Based on the determined memory access request, and as part of the forward path of the memory device 108, the target 304 can forward a memory request 354 over the interconnect 306 to a memory controller 308, which is the first memory controller 308-1 in this example. For other memory accesses, the targeted data may be accessed with the second DRAM 310-2 through the second memory controller 308-2. Thus, the first memory controller 308-1 receives the memory request 354 via the internal interconnect 306.

The first memory controller 308-1 can prepare a memory command 356 based on the memory request 354. The first memory controller 308-1 can provide the memory command 356 to the first DRAM 310-1 over an interface or interconnect appropriate for the type of DRAM or other memory component. The first DRAM 310-1 receives the memory command 356 from the first memory controller 308-1 and can perform the corresponding memory operation. Based on the results of the memory operation, the first DRAM 310-1 can generate a memory response 362. If the memory request 316 is for a read operation, the memory response 362 can include the requested data. If the memory request 316 is for a write operation, the memory response 362 can include an acknowledgement that the write operation was performed successfully. As part of the return path of the memory device 108, the first DRAM 310-1 can provide the memory response 362 to the first memory controller 308-1.

Continuing the return path of the memory device 108, the first memory controller 308-1 receives the memory response 362 from the first DRAM 310-1. Based on the memory response 362, the first memory controller 308-1 can prepare a memory response 364 and transmit the memory response 364 to the target 304 via the interconnect 306. The target 304 receives the memory response 364 from the first memory controller 308-1 via the interconnect 306. Based on this memory response 364, and responsive to the corresponding memory request 316, the target 304 can formulate a response 318 for the requested memory operation. The memory response 318 can include read data or a write acknowledgment and be formulated in accordance with one or more protocols of the interconnect 106.

To respond to the memory request 316 from the host device 104, the target 304 of the memory device 108 can transmit the memory response 318 to the initiator 302 over the interconnect 106. Thus, the initiator 302 receives the response 318 from the target 304 via the interconnect 106. The initiator 302 can therefore respond to the "originating" memory access request 352, which is from the processor 114 in this example. To do so, the initiator 302 prepares a memory access response 366 using the information from the response 318 and provides the memory access response 366 to the processor 114. In these manners, the host device 104 can obtain memory access services from the memory device 108 using the interconnect 106. Example aspects of an interconnect 106 are described next. In accordance with one or more aspects described herein, the ASL 122 associated with the DRAM 310-1 or DRAM 310-2 may enable dynamic address scrambling for DRAM access such that the logical-to-physical address mappings within a DRAM are indirect or do not have a one-to-one correspondence.

The interconnect 106 can be implemented in a myriad of manners to enable memory-related communications to be exchanged between the initiator 302 and the target 304. Generally, the interconnect 106 can carry memory-related information, such as data or a memory address, between the initiator 302 and the target 304. In some cases, the initiator 302 or the target 304 (including both) can prepare memory-related information for communication across the interconnect 106 by encapsulating such information. The memory-related information can be encapsulated or incorporated into, for example, at least one packet (e.g., at least one flit). One or more packets may include at least one header with information indicating or describing the content of each packet.

In example implementations, the interconnect 106 can support, enforce, or enable memory coherency for a shared memory system, for a cache memory, for combinations thereof, and so forth. Thus, the memory device 108 can operate in a cache coherent memory domain in some cases.

The system 300, the initiator 302 of the host device 104, or the target 304 of the memory device 108 may operate or interface with the interconnect 106 in accordance with one or more physical or logical protocols. For example, the interconnect 106 may be built in accordance with a Peripheral Component Interconnect Express® (PCIe or PCI-E) standard. Applicable versions of the PCIe standard may include 1.x, 2.x, 3.x, 4.0, 5.0, 6.0, and future or alternative versions of the standard.

In some cases, at least one other standard is layered over the physical-oriented PCIe standard. For example, the initiator 302 or the target 304 can communicate over the interconnect 106 in accordance with a Compute Express Link™ (CXL) standard. Applicable versions of the CXL standard may include 1.x, 2.0, and future or alternative versions of the standard. Thus, the initiator 302 and/or the target 304 may operate so as to comport with a PCIe standard and/or a CXL standard. A device or component may comprise or operate in accordance with a CXL Type 1, Type 2, or Type 3 device.

Example Techniques and Hardware

Figure 4:
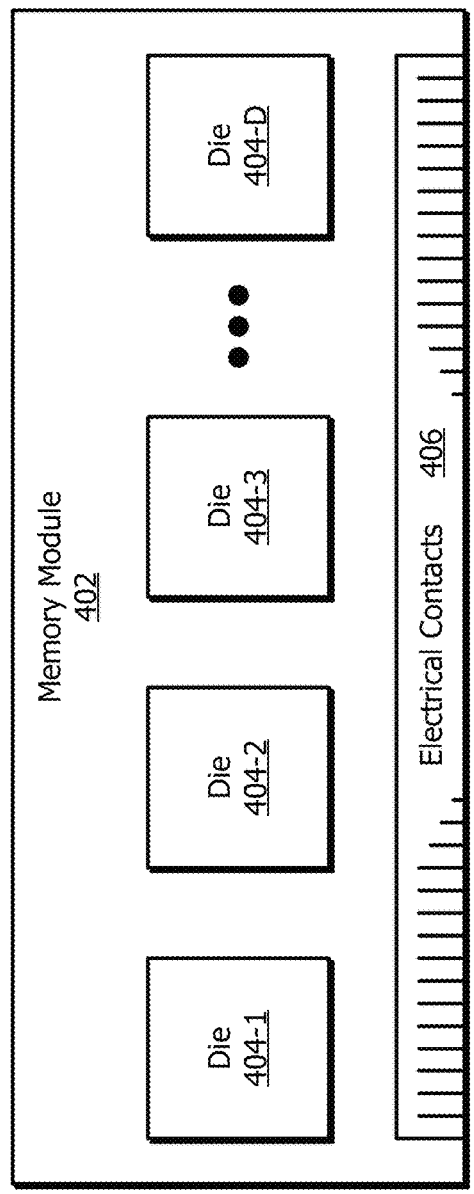
FIG. 4 illustrates an example memory device in which aspects of dynamic address scramble may be implemented.

FIG. 4 illustrates at 400 an example memory device in which aspects of dynamic address scramble can be implemented. In this example, the memory device includes a memory module 402, which may be configured similar to or different from the memory device 108 as described with reference to FIGS. 1-3. In aspects, the memory module 402 includes multiple dies 404. As illustrated, the memory module 402 includes a first die 404-1, a second die 404-2, a third die 404-3, and a Dth die 404-D, with "D" representing a positive integer. As a few examples, the memory module 402 can be a SIMM or a DIMM. As another example, the memory module 402 can interface with other components via a bus interconnect (e.g., a Peripheral Component Interconnect Express (PCIe®) bus). The memory device 108 illustrated in FIGS. 1 and 2 can correspond, for example, to a single die 404, multiple dies (or dice) 404-1 through 404-D, or a memory module 402 with one or more dies 404. As shown, the memory module 402 can include one or more electrical contacts 406 (e.g., pins) to interface the memory module 402 to other components. In some examples, the memory module 402 may include the ASL 122 (not shown) discussed herein. In particular examples, the memory module 402 may include a register (e.g., a mode register) associated with the ASL 122 that identifies address scramble settings for one or more of the multiple dies 404. In aspects, the ASL 122 may implement respective address scramble patterns for the one or more dies 404. In some cases, the ASL 122 implements a unique address scramble pattern for each of the one or more dies 404. In aspects, each address scramble pattern is implemented in a way that distributes disturbed rows in a unique way compared to other scramble patterns, such as those of other dies. This may be done to spread disturb fails to other codewords and reduce a probability of uncorrectable ECC failure events. Alternately or additionally, a memory controller operably associated with the ASL 122 may change or alter a respective address scramble pattern for a die 404 at any suitable time, such as on reset, at power-up, at predefined time intervals, based on die access thresholds, or at random times (e.g., after migrating data of the die 404 to another memory location).

The memory module 402 can be implemented in various manners. For example, the memory module 402 may include a PCB, and the multiple dies 404-1 through 404-D may be mounted or otherwise attached to the PCB. The dies 404 (e.g., memory dies) may be arranged in a line or along two or more dimensions (e.g., forming a grid or array). The dies 404 may have a similar size or may have different sizes. Each die 404 may be similar to another die 404 or different in size, shape, data capacity, or control circuitries. The dies 404 may also be positioned on a single side or on multiple sides of the memory module 402. In some cases, the memory module 402 may be part of a CXL memory system or module.

Figure 5:
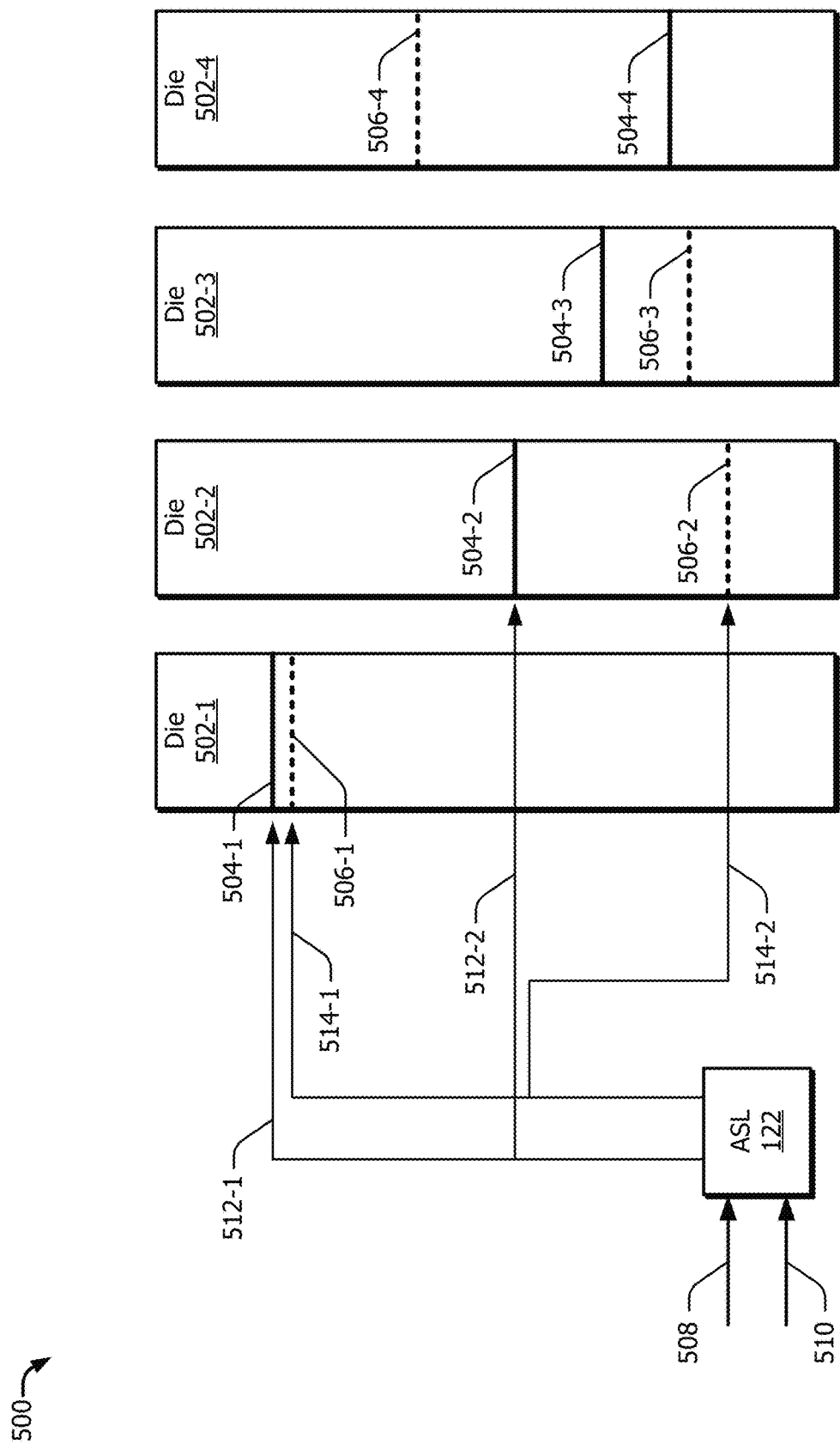
FIG. 5 illustrates an example implementation of dynamic address scrambling across multiple dies.

FIG. 5 illustrates an example 500 of dynamic address scrambling across multiple dies in accordance with one or more aspects. As mentioned above, a malicious actor may implement a usage-based disturb attack by activating or rapidly pre-charging a row (referred to as the aggressor row) in a memory device to affect adjacent rows. These victim rows in the memory device are physically adjacent to the aggressor row. When an address scramble is different for each memory die, then the rows adjacent to the aggressor rows will exist in different logical codewords. A logical codeword may identify a correspondence between a physical memory location and a logical memory location. Using a different address scramble for each memory die causes effects (e.g., victim row fails) associated with a usage-based disturb attack to be spread out over more codewords and allows the use of ECC (Error Correction Code) bits for correcting this reduced numbers of failures on each codeword.

As discussed herein, if a malicious actor targets a specific region of a memory device, the malicious actor may have access to that region of the memory device in a current or active address scramble. However, after an address scramble pattern change, the malicious actor will lose any information relating to a logical-to-physical mapping of the memory device that they previously obtained.

In the example of FIG. 5, the solid lines 504-1 through 504-4 represent respective portions of a row that is disturbed by a malicious actor or aggressor row. In other words, a malicious actor may disturb a logical address row in memory that, due to the address scramble patterns of each die, map or translate to codewords at different physical locations as indicated by lines 504-1 through 504-4 on the dies 502-1 through 502-4. In this example, the broken lines 506-1 through 506-4 represent portions of a victim row (intended or otherwise), the codewords of which are also scrambled in accordance with the address scramble patterns of each die. As shown in FIG. 5, only one portion or codeword of the victim row at 506-1 is physically adjacent to a portion of the aggressor row at 504-1 on the first die. As such, the malicious actor may be able to cause a usage-based disturb failure or disruption of the codeword of the target victim row at 506-1. However, in dies 502-2, 502-3, and 502-4, the different respective address scramble patterns map the other portions or codewords of a logical address row after 506-1 to other physical locations on each of those memory dies. As such, the use of different address scramble patterns can prevent further usage-based disturb failure in dies 502-2, 502-3, and 502-4 because the other portions of the disturbed row 504 (e.g., row of logical addresses) are not adjacent the other portions of the victim row 506 (e.g., 506-2, 506-3, 506-4). Because each of the die 502-1, 502-2, 502-3, and 502-4 may implement a different address scramble pattern (e.g., default or configured), if a malicious actor is able to discern an address scramble pattern for one die, that knowledge cannot be used to attack different dies or after the address scramble pattern of that die changes.

As shown in FIG. 5, example 500 may include an instance of the ASL 122, which may be configured with address scramble settings for dies 502-1, 502-2, 502-3, and 502-4, as discussed herein. Generally, the ASL 122 may provide for scrambled logical-to-physical mappings illustrated for the first two dies 502-1 and 502-2. Here, assume data (e.g., respective codewords) for a logical address row 508 corresponds to the aggressor row 504 and the other data (e.g., respective codewords) for a logical address row 510 corresponds to the targeted victim row 506. The ASL 122, which may be implemented on each die (not shown), enables scrambling of the logical-to-physical mappings for each die such that different portions of the data or codewords are mapped to different physical locations on each die such that other portions or codewords of the victim row are not physically adjacent to the aggressor row. In particular, a portion or codeword of the aggressor row at 512-1 may be physically adjacent to a portion or codeword of the targeted victim row at 514-1. However, due to the scrambling of the addresses in other die 502, another portion or codeword of the aggressor row at 512-2 is not physically adjacent to another portion or codeword of the targeted victim row at 514-2, and so on for other dies 502-3 through 502-n, where n is any suitable integer.

In example implementations, a particular memory device may be set to load or maintain its default address scramble pattern, which may be different for each die of a memory device. In other situations, a memory device may be set to change or alter the default address scramble pattern as discussed herein. In some examples, an enable bit (or a fuse) that corresponds to a specific die controls whether the address scramble feature is enabled for that die. The enable bit (or fuse) may be located, for example, in a mode register, ROM, or other type of register of a memory device or die. Thus, address scramble patterns and other address scramble features may be enabled, disabled, and/or configured on a memory device or an individual die of the memory device.

Figure 6:
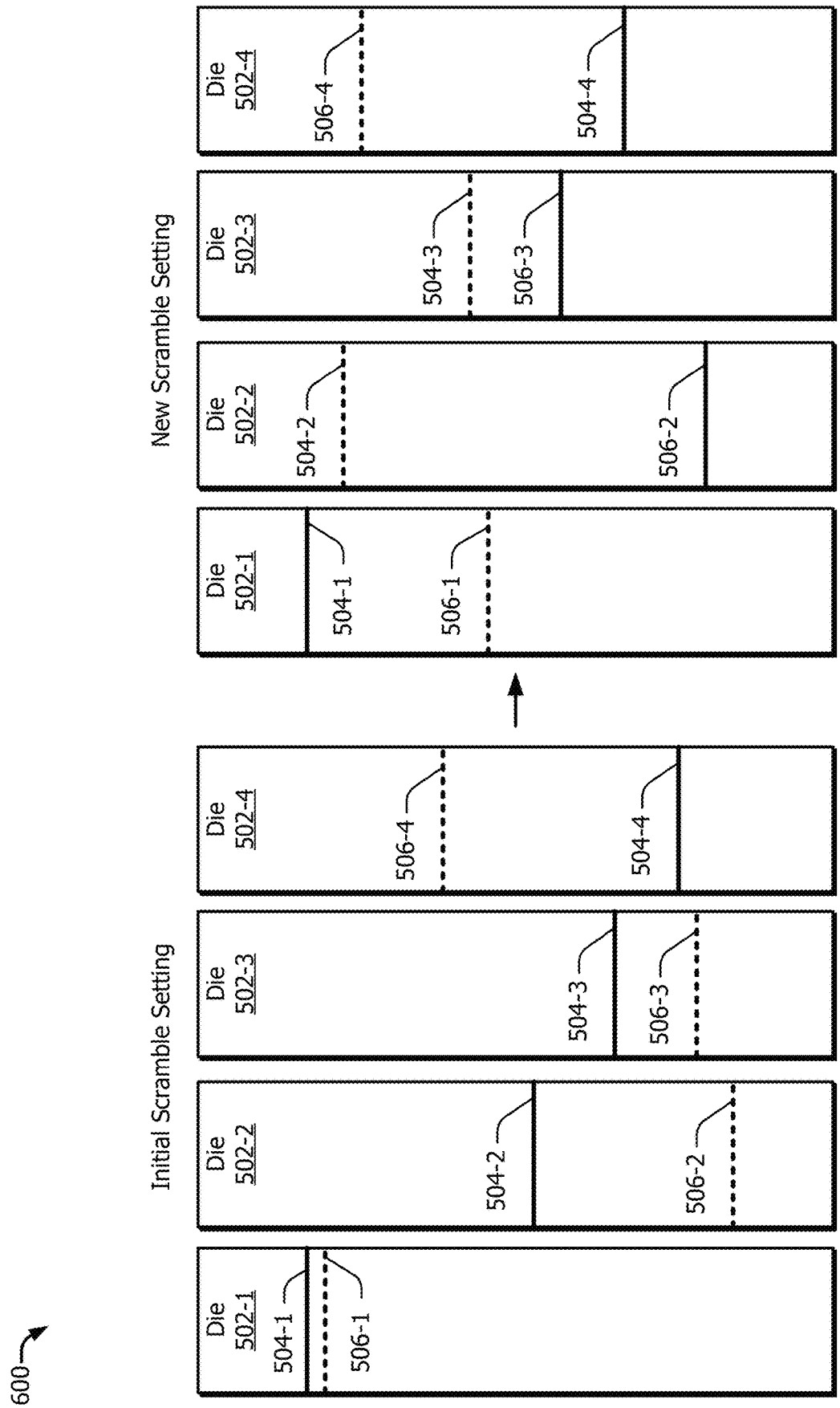
FIG. 6 illustrates an example implementation of changing address scramble settings across multiple dies.

FIG. 6 illustrates an example 600 of changing address scramble settings across multiple dies. With reference to the preceding example, the four dies 502-1, 502-2, 502-3, and 502-4 on the left side of FIG. 6 may represent an initial scramble setting. This initial scramble setting is similar to the setting shown in FIG. 5, where, in die 502-1, at least one portion or codeword of the victim row 506 is adjacent to the aggressor row 504 of a disturb attack. In this situation, the disturbing of row 504 may successfully disrupt victim row 506. However, in dies 502-2, 502-3, and 502-4, the different address scramble patterns place other portions of the targeted victim row at different physical locations, which may prevent further failure or disruption associated with disturbing row 504 in dies 502-2, 502-3, and 502-4 because those portions of the victim row 506 are not adjacent to the disturbed row 504.

In this example, the four dies 502-1, 502-2, 502-3, and 502-4 on the right side of FIG. 6 illustrate a new scramble setting after a new address scramble has been loaded. For example, new address scramble patterns may be loaded after particular events (e.g., stored data is invalid, not current, flushable, erasable, etc.), after a system reset, after a predetermined time period, and the like. Additionally, a new address scramble can be loaded if a system or an administrator of a system identifies a system malfunction or suspects an attack. This new address scramble may resolve the system malfunction or thwart a malicious actor by setting a new address scramble pattern. For example, if a number of row accesses or a rate of row accesses exceeds a threshold for a memory device or memory die, a memory controller may initiate an address scramble pattern update that includes copying data from the memory device to another location and configuring dies of the memory device with different address scramble patterns.

As shown on the right side of FIG. 6, the new address scramble changes the physical locations of respective portions or respective codewords of the disturbed row 504 and victim rows 506, likely separating any previous adjacent codewords of the aggressor and the targeted victim row. Thus, any previous knowledge about the address information acquired by a malicious actor based on previous scramble settings will have no value because the new scramble settings are different from the previous scramble settings and re-map the logical-to-physical correlation of the rows in the memory device.

In example implementations, the address scrambling scheme may use a register (e.g., a mode register or other type of register) that provides multiple values associated with an address scramble. For example, the register bits may be flipped or rearranged in a random order to provide different address scrambling patterns for memory dies. Alternatively, different groups of register bits or other pre-defined address scramble patterns may be selected randomly. For example, the new value in the register (or the newly selected address scramble pattern) can be used to scramble the relationships associated with the logical-to-physical conversion of the rows in the memory die. As used herein, "randomly" includes pseudo-random methods and techniques, which may be used to alter existing scramble pattern settings or generate random address scramble patterns.

In other implementations, the address scrambling process may randomly select an address scramble pattern from a group of multiple different address scramble patterns. By randomly selecting an address scramble pattern each time the pattern is updated, a malicious actor is not likely to detect any relationships between different address scramble patterns. Additionally, the systems and methods described herein may select address scramble patterns for multiple dies such that no two dies have the same address scramble pattern. In aspects, a memory device may provide a command to a memory controller to change the address scramble settings. For example, an MRW (Mode Register Write) command may be issued to change one or more scramble mode register bits.

In example implementations, when a memory device is powered up or reset, a default address scramble value is loaded from ROM or other persistent memory of a memory device or memory die. In aspects, a memory controller may not know actual address scramble patterns or rules, the memory controller may set or alter different values for configuring an address scramble pattern, which may result in a different address scramble on the memory device or dies thereof. In example implementations, a memory controller may choose to change the address scramble at any time, such as randomly, based on a counter, based on a timer, or so forth. Alternatively or additionally, this address scramble change may occur for any reason, which may include when powering up the memory device, resetting the memory device, the data stored in the memory device is invalid, not current, flushable, or erasable (e.g., the data has already been copied to another location), or the like.

Example Methods

This section describes example methods with reference to the flow diagrams of FIGS. 7-11 for implementing aspects of dynamic address scramble in accordance with one or more aspects. These descriptions may also refer to components, entities, and other aspects depicted in FIGS. 1-6, which reference is made only by way of example. Such reference is made by way of example only, and the described method operations are not necessarily limited to performance by one entity or multiple entities operating on a single device. Generally, the methods 700-1100 are shown as sets of operations (or acts) performed and are not necessarily limited to the order or combinations in which the operations are shown herein. Furthermore, any of one or more of the operations can be repeated, combined, reorganized, or linked to provide a wide array of additional and/or alternative methods.

Figure 7:
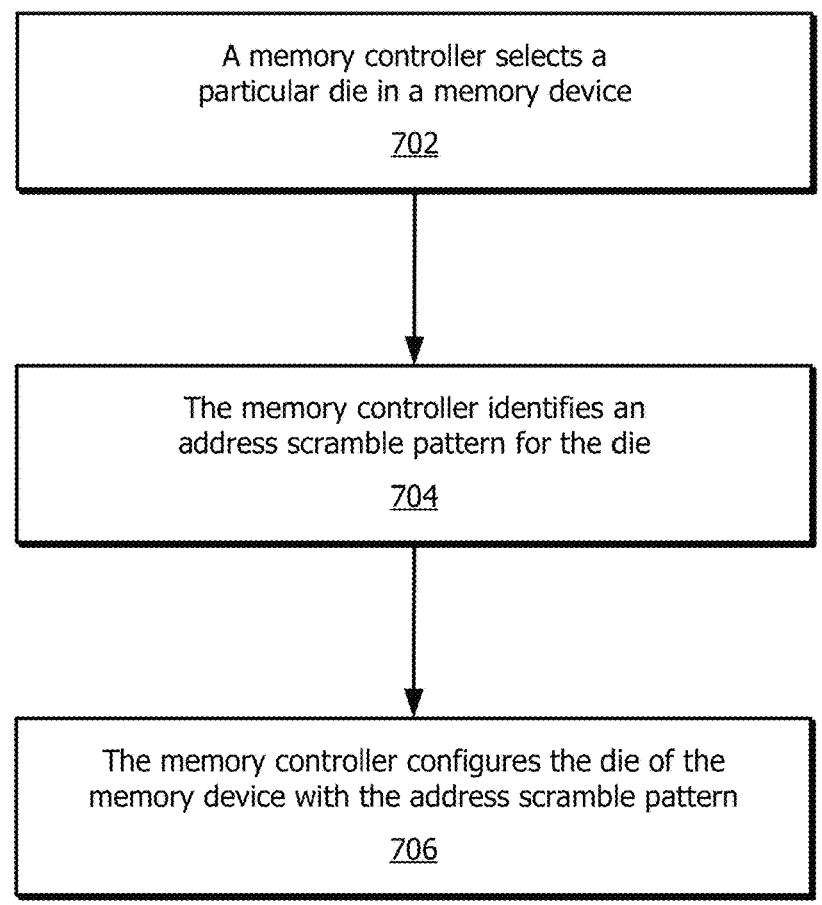
FIG. 7 illustrates an example method for configuring a memory die to implement dynamic address scrambling in accordance with one or more aspects.

FIG. 7 illustrates an example method 700 for configuring a memory die to implement dynamic address scrambling in accordance with one or more aspects. In aspects, a memory controller 110, memory controller 118, memory controller 308, ASL 122, and/or ASL 124 may implement various operations of the method 700.

At 702, a memory controller (or other entity) selects a particular die in a memory device that is operably coupled to the memory controller. For example, the method 700 may be performed, for example, by an electronic device, computing system, a memory controller, a memory device, and the like, such as those described with reference to FIGS. 1-6. In some cases, the memory controller selects the die in response to an event or determination that an address scramble pattern of the die is configurable or reconfigurable.

At 704, the memory controller identifies (or determines) an address scramble pattern for the die. In some cases, the memory controller or ASL of the memory device selects an address scramble pattern from multiple address scramble patterns maintained for use with dies of the memory device. In other cases, the memory controller or ASL may flip or shift one or more bits (e.g., of a four-bit register) of a current address scramble pattern to generate another address scramble pattern for the memory die.

At block 706, the memory controller configures the die of the memory device with the address scramble pattern. For example, the memory controller may write the address scramble pattern to a register in the memory device, which may include a mode register or a register in ASL associated with the memory die. In other examples, the address scramble pattern may be loaded to a register of the memory device from a different device or from any other storage location. In aspects, the memory controller may include address scramble logic capable of generating and managing various address scramble patterns for memory devices and/or dies thereof. In some implementations, the address scramble logic in the memory controller can instruct at least one of the dies in the memory device to alter or change a current address scramble pattern of the die.

As discussed herein, the current address scramble pattern may be changed based on an event, such as a power reset, at power-up, or an indication that data stored on the memory device is no longer needed. In some examples, the memory controller generates multiple address scramble patterns, where each of the multiple address scramble patterns is associated with a single die in the memory device. Additionally, each of the multiple address scramble patterns may be unique with respect to the other address scramble patterns.

Figure 8:
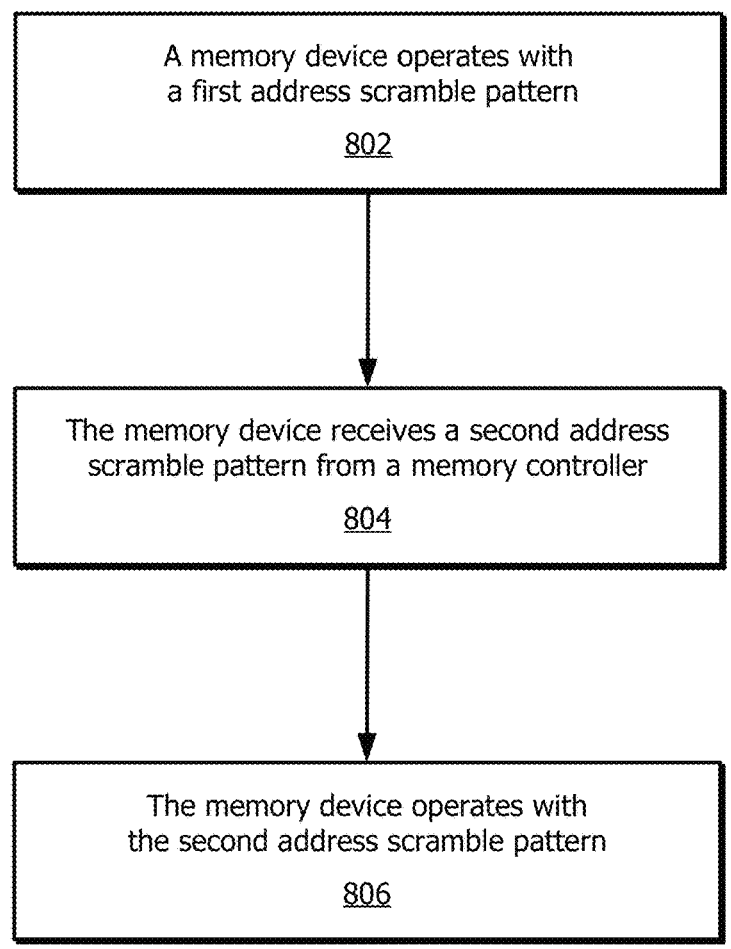
FIG. 8 illustrates an example method for changing address scramble patterns in accordance with one or more aspects.

FIG. 8 illustrates an example method 800 for changing address scramble patterns in accordance with one or more aspects. In aspects, a memory controller 110, memory controller 118, memory controller 308, ASL 122, and/or ASL 124 may implement various operations of the method 800.

At block 802, a memory device operates with a first address scramble pattern. The method 800 may be performed, for example, by an electronic device, computing system, a memory controller, a memory device, or the like as described with reference to FIGS. 1-6. The first address scramble pattern may be a default address scramble pattern of a memory die of the memory device or a configured address scramble pattern of the memory die.

At block 804, the memory device receives a second address scramble pattern from a memory controller or other device. In aspects, the memory device may receive a command or indication to alter or change the first address scramble pattern to the second address scramble pattern. For example, the memory controller may toggle, flip, or shift one or more bits in a register that controls an address scramble pattern for the memory die or multiple memory dies of the memory device. In some cases, the second address scramble pattern is received or loaded when the memory device is reset, powered on, or when data of the memory device has been migrated to another memory location, which may enable the first address scramble pattern to be changed without data loss.

At block 806, the memory device continues operating with the second address scramble pattern. As noted, the memory device may change an existing address scramble pattern by shifting at least one bit in the address scramble pattern. This shifting may be performed in a pseudo-random manner. In some examples, the memory device is a dynamic random-access memory (DRAM). In other examples, the memory device is a CXL memory device, such as a Type 3 CXL memory device. Alternatively or additionally, a memory controller may migrate previously-migrated data back to the memory die once the memory die is configured to implement the second address scramble pattern.

Figure 9:
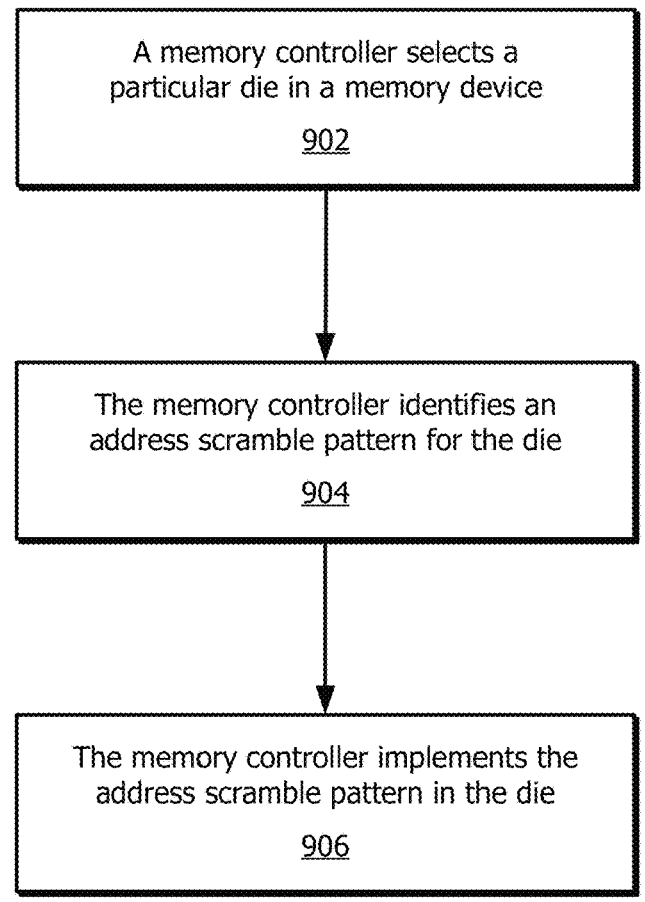
FIG. 9 illustrates an example method for directing a memory die to implement an address scramble pattern in accordance with one or more aspects.

FIG. 9 illustrates an example method 900 for directing a memory die to implement an address scramble pattern in accordance with one or more aspects. In aspects, a memory controller 110, memory controller 118, memory controller 308, ASL 122, and/or ASL 124 may implement various operations of the method 900.

At 902, a memory controller selects a particular die in a memory device. The method 900 may be performed, for example, by an electronic device, computing system, a memory controller, a memory device, or the like as described with reference to FIGS. 1-6. In some cases, the memory controller selects a subset of dies (e.g., that correspond to a rank) or all dies of the memory device.

At block 904, the memory controller identifies an address scramble pattern for the particular die. In some cases, the memory controller randomly selects respective address scramble patterns for one or more dies of the memory device from a plurality or set of address scramble patterns. Alternatively or additionally, the memory controller may toggle, flip, or shift one or more bits in a register that controls the respective address scramble patterns implemented by the one or more dies of the memory device.

At block 906, the memory controller implements the address scramble pattern in the particular die. In some aspects, the memory controller determines when or if the address scramble pattern of a die can be configured, such as without data loss. For example, the memory controller may access or determine a value of an enable/disable bit associated with a memory device or a memory die. The memory controller is permitted to change an address scramble pattern associated with the memory device or memory die based on the value of the enable/disable bit. In particular implementations, the enable/disable bit indicates whether the memory device (or memory die) contains data that can be deleted in response to changing the address scramble pattern. Alternatively or additionally, the memory controller may be configured to alter or change respective address scramble patterns of dies of the memory device in response to detecting a reset event or power-on event of the memory device.

Figure 10:
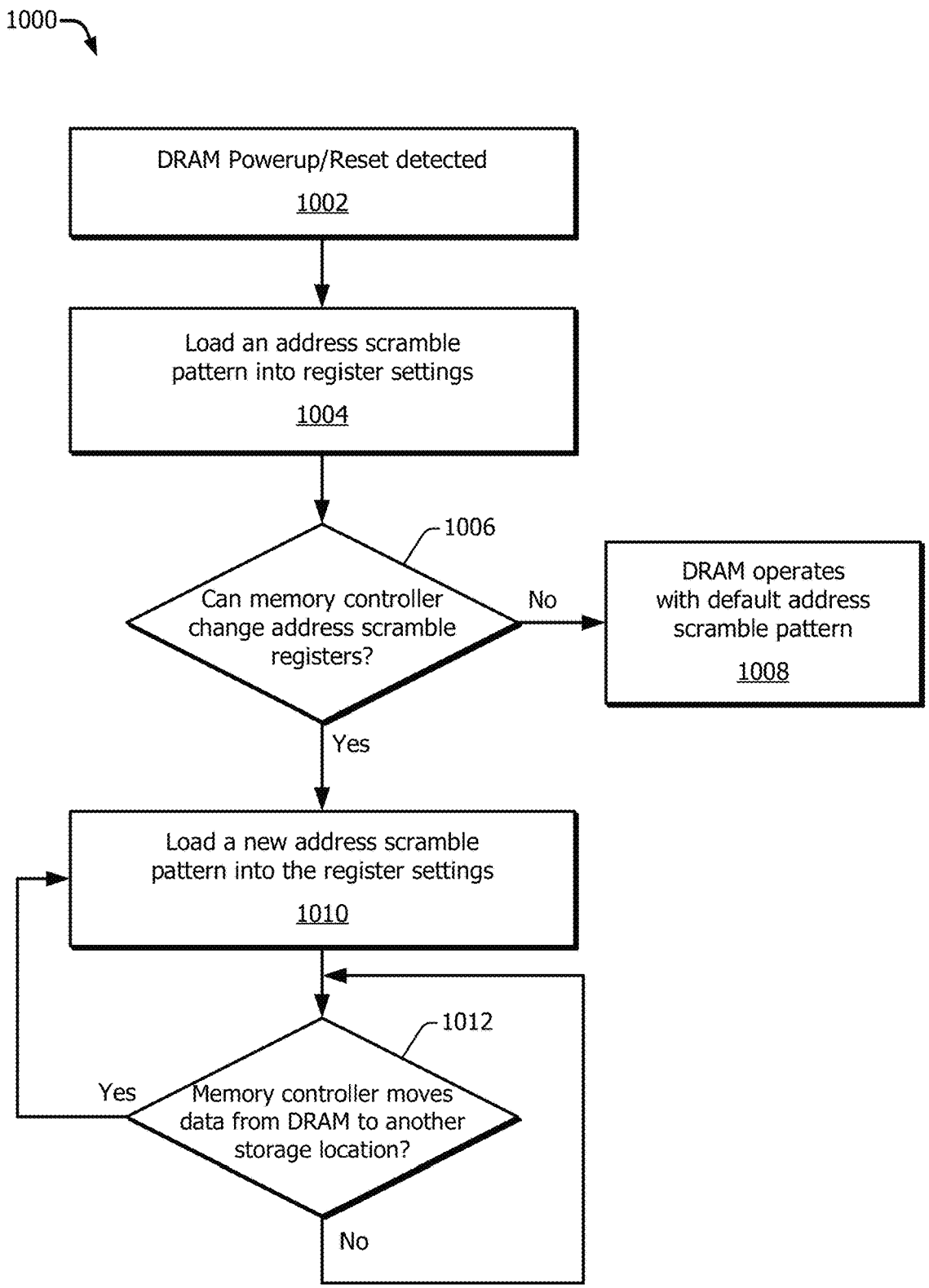
FIG. 10 illustrates an example method for implementing dynamic address scramble in accordance with one or more aspects.

FIG. 10 illustrates an example method 1000 for implementing dynamic address scramble in accordance with one or more aspects. In aspects, a memory controller 110, memory controller 118, memory controller 308, ASL 122, and/or ASL 124 may implement various operations of the method 1000.

At 1002, a memory controller detects a DRAM (or other memory device) power-up or reset. The process 1000 may be performed, for example, by a computing system, a memory controller, a memory device, and the like. Alternatively or additionally, the memory controller may determine that one or more dies of the memory device contain data that is invalid, not current, flushable, or erasable.

At 1004, the memory controller loads an address scramble pattern into one or more register settings. In some cases, the address scramble pattern is a default address scramble pattern, an incremented address scramble pattern, a randomized address scramble pattern, or so forth. In aspects, the memory controller may load or assign different address scramble patterns to respective dies of the memory device.

At 1006, the memory controller determines whether a memory controller can change the address scramble registers. In some situations, a memory controller is prevented from changing the address scramble registers at certain times, such as when data needs to be maintained in one or more dies of the memory device. In some examples, operation 1006 may include generating a request to determine whether the current address scramble pattern can be changed (e.g., the stored data is no longer needed, so an address scramble change can occur because loss of data due to the new address scramble is not a problem). Alternatively or additionally, operation 1006 may be initiated in response to a reset event or power-on event, at which point the address scramble pattern settings of dies of the memory device may be changed.

If the memory controller cannot change the address scramble registers, block 1008 indicates that the DRAM operates with the current or a default address scramble pattern. In some implementations, the default address scramble pattern may be different for each die, such as being set through ROM or burned into one-time programmable memory of each die or the memory device.

If 1006 determines that the memory controller can change the address scramble registers, block 1010 loads a new address scramble pattern into the register settings. Alternatively or additionally, the memory controller can alter bits in an address scramble pattern register effective to implement a different address scramble pattern for the one or more dies of the memory device. As discussed herein, loading the new address scramble pattern into the register settings may cause a malicious actor to lose any physical mapping information obtained based on attacks against the previous address scramble pattern.

At 1012, the process 1000 determines whether the memory controller has moved data from the one or more dies of the DRAM to another storage location. For example, the memory controller may migrate or copy data from one or more dies of the memory device, which would then enable the address scramble pattern to be changed without data loss. If the memory controller has moved data from the one or more dies of the DRAM to another storage location, the method 1000 can return to block 1010, at which point a new address scramble pattern is loaded into the register settings. If the memory controller has not moved data from the DRAM, the method 1000 may repeat operation 1012 to continue monitoring whether the memory controller has moved data from the DRAM to another storage location to enable another change of the address scramble pattern. After the data has been moved from DRAM, the method 1000 may then load the new address scramble pattern into the register of the DRAM. Further, the memory controller may return the data from the other storage location to the DRAM using the updated address scramble pattern.

Figure 11:
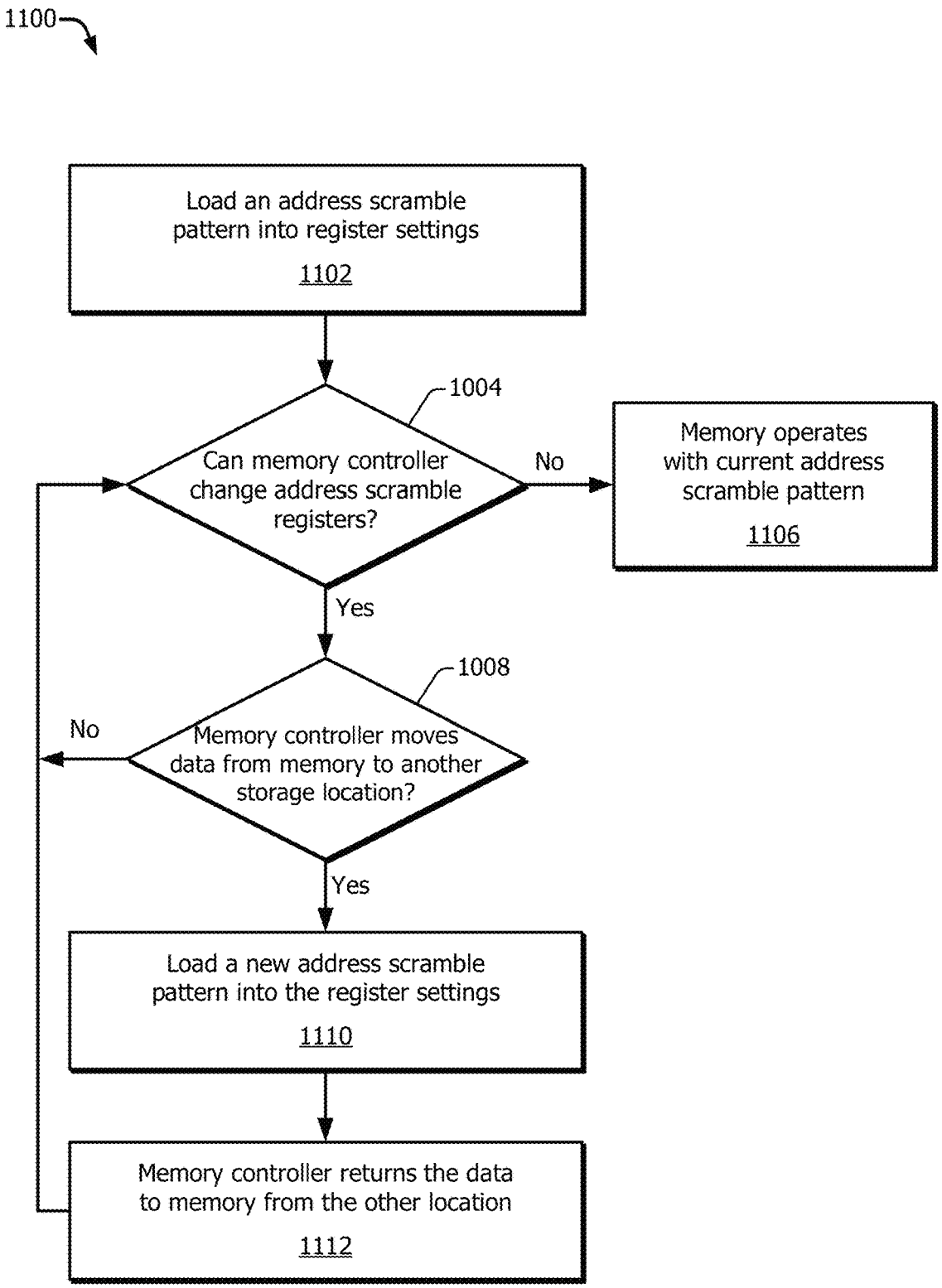
FIG. 11 illustrates an example method for implementing dynamic address scramble with non-volatile memory in accordance with one or more aspects.

FIG. 11 illustrates an example method 1100 for implementing dynamic address scramble with non-volatile memory in accordance with one or more aspects. In aspects, a memory controller 110, memory controller 118, memory controller 308, ASL 122, and/or ASL 124 may implement various operations of the method 1100. The method 1100 may be implemented with any suitable type of non-volatile memory, which may include Flash memory, non-volatile storage, ferroelectric RAM, magnetic storage media, optical storage media, non-volatile memory (NVM) Express (NVMe), or the like.

At 1102, a memory controller loads an address scramble pattern into one or more register settings for a memory, which may include a non-volatile memory. In some cases, the address scramble pattern is a default address scramble pattern, an incremented address scramble pattern, a randomized address scramble pattern, or so forth. In aspects, the memory controller may load or assign different address scramble patterns to respective dies or channels (e.g., NAND channels) of the memory device (e.g., solid-state drive (SSD)).

At 1104, the memory controller determines whether a memory controller can change the address scramble registers. In some situations, a memory controller is prevented from changing the address scramble registers at certain times, such as when data needs to be maintained in one or more dies of the memory device. In some examples, operation 1104 may include generating a request to determine whether the current address scramble pattern can be changed (e.g., the stored data is no longer needed, so an address scramble change can occur because loss of data due to the new address scramble is not a problem). Alternatively or additionally, operation 1104 may be initiated in response to determining that data of the memory device has been moved or copied to another location, at which point the address scramble pattern settings of dies or channels of the memory device may be changed.

If the memory controller cannot change the address scramble registers, block 1106 indicates that the memory device operates with the current or a default address scramble pattern. In some implementations, the default address scramble pattern may be different for each die or channel of the memory device, such as being set through ROM or burned into one-time programmable memory of each die or the memory device.

If 1104 determines that the memory controller can change the address scramble registers, block 1108 determines whether the memory controller has copied or moved data from the one or more dies of the memory to another storage location. For example, the memory controller may migrate or copy data from one or more dies of the memory device, which would then enable the address scramble pattern to be changed without data loss. If the memory controller has moved data from the one or more dies of the memory device to another storage location, the method 1100 can continue to block 1110, at which point a new address scramble pattern is loaded into the register settings. Alternatively or additionally, the memory controller can alter bits in an address scramble pattern register effective to implement a different address scramble pattern for the one or more dies (or channels) of the memory device. As discussed herein, loading the new address scramble pattern into the register settings may cause a malicious actor to lose any physical mapping information obtained based on attacks against the previous address scramble pattern. If the memory controller has not moved data from the DRAM, the method 1100 may repeat operation 1108 to continue monitoring whether the memory controller has moved data from the DRAM to another storage location to enable another change of the address scramble pattern. After the data has been moved from DRAM, the method 1000 may then load the new address scramble pattern into the register of the DRAM.

At 1112, the memory controller returns the data to the memory device from the other storage location. For example, the memory controller may be configured to migrate the data back to the memory device using the updated address scramble pattern in response to successfully loading or setting the new address scramble pattern into the scramble registers that correspond to the memory. From operation 1112, the method 1100 may return to and/or repeat from operation 1004 to provide subsequent updates to the address scramble patterns of the memory device (e.g., NVM device).

CONCLUSION

Although implementations for dynamic address scramble have been described in language specific to certain features and/or methods, the subject of the appended claims is not necessarily limited to the specific features or methods described. Rather, the specific features and methods are disclosed as example implementations for dynamic address scramble.

What is claimed is:

1. A method comprising:
    monitoring, by a memory controller coupled to a memory device comprising a plurality of memory dies, a timer from a previous configuration of address scramble patterns of the memory device;
    migrating data from the memory device to another memory device in response to the timer reaching a threshold that enables the memory controller to change the address scramble patterns of the memory device;
    determining, by the memory controller, that the address scramble patterns of the memory device are in a configurable state after the data has been migrated from the memory device to the other memory device;
    selecting, from a plurality of address scramble patterns implemented by the memory controller, a first address scramble pattern for a first memory die of the plurality of memory dies, the first address scramble pattern providing a first logical-to-physical mapping for row addresses of the first memory die of the memory device;
    selecting, from the plurality of address scramble patterns implemented by the memory controller, a second address scramble pattern for a second memory die of the plurality of memory dies, the second address scramble pattern providing a second logical-to-physical mapping for row addresses of the second memory die of the memory device that is different from the first logical-to-physical mapping for row addresses of the first memory die of the memory device;
    configuring, by the memory controller, the first memory die of the memory device to use the first address scramble pattern for logical-to-physical mapping of the row addresses associated with access of the first memory die of the memory device; and
    configuring, by the memory controller, the second memory die of the memory device to use the second address scramble pattern for logical-to-physical mapping of the row addresses associated with access of the second memory die of the memory device.

2. The method of claim 1, wherein each address scramble pattern of the plurality of address scramble patterns defines a logical-to-physical conversion of row addresses for a memory die of the memory device that is unique from respective logical-to-physical mappings of row addresses for other memory dies that are configured with different address scramble patterns.

3. The method of claim 1, wherein:
    configuring the first memory die of the memory device to use the first address scramble pattern comprises setting a value indicative of the first address scramble pattern in a register of the memory device; or
    configuring the second memory die of the memory device to use the second address scramble pattern comprises setting a value indicative of the second address scramble pattern in the register of the memory device.

4. The method of claim 1, wherein each of the plurality of address scramble patterns is unique with respect to others of the plurality of address scramble patterns implemented by the memory controller.

5. The method of claim 1, wherein each respective address scramble pattern of the plurality of address scramble patterns is associated with a single memory die of the plurality of memory dies of the memory device.

6. The method of claim 1, further comprising:
    implementing, by the memory controller, the previous configuration of the address scramble patterns of the memory device in response to one of a power reset event, a power-on event, or an indication that data stored on the memory device is no longer needed.

7. The method of claim 1, further comprising:
selecting the first address scramble pattern by randomly selecting the first address scramble pattern from the plurality of address scramble patterns; or
selecting the second address scramble pattern by randomly selecting the second address scramble pattern from the plurality of address scramble patterns.

8. The method of claim 7, further comprising:
generating the first address scramble pattern by randomly changing at least one bit in a register of the memory device; or
generating the second address scramble pattern by randomly changing at least one bit in the register of the memory device.

9. The method of claim 1, further comprising:
determining, by the memory controller, a value of an enable/disable bit associated with the memory device; and
changing, by the memory controller, the first address scramble pattern of the first memory die or the second address scramble pattern of the second memory die based on the determining.

10. The method of claim 9, wherein the enable/disable bit indicates whether the memory device contains data that is invalid, not current, flushable, or erasable.

11. The method of claim 1, wherein the memory device is a dynamic random-access memory (DRAM).

12. The method of claim 11, wherein the memory device is a Compute Express Link™ (CXL) memory device.

13. The method of claim 12, wherein the CXL memory device is a Type 3 CXL memory device.

14. An apparatus comprising:
an interface configured to couple to a memory controller;
a plurality of memory dies coupled to the interface;
a timer with a threshold configured to enable the memory controller to change address scramble patterns of the plurality of memory dies; and
address scramble logic that is coupled to the plurality of memory dies and configured to:
monitor the timer from a previous configuration of the address scramble patterns of the plurality of memory dies;
migrate, in response to the timer reaching the threshold, data from a first memory die and a second memory die of the plurality of memory dies to other memory dies of the plurality of memory dies;
select, from a plurality of address scramble patterns implemented by the address scramble logic, a first address scramble pattern for the first memory die of the plurality of memory dies, the first address scramble pattern providing a first logical-to-physical mapping for row addresses of the first memory die of the apparatus;
select, from the plurality of address scramble patterns implemented by the address scramble logic, a second address scramble pattern for the second memory die of the plurality of memory dies, the second address scramble pattern providing a second logical-to-physical mapping for row addresses of the second memory die of the apparatus that is different from the first logical-to-physical mapping for row addresses of the first memory die of the apparatus;
configure the first memory die of the apparatus to use the first address scramble pattern for logical-to-physical mapping of the row addresses associated with access of the first memory die of the apparatus; and
configure the second memory die of the apparatus to use the second address scramble pattern for logical-to-physical mapping of the row addresses associated with access of the second memory die of the apparatus.

15. The apparatus of claim 14, wherein each address scramble pattern of the plurality of address scramble patterns implemented by the address scramble logic defines a logical-to-physical conversion of row addresses for a memory die of the plurality of memory dies that is different from respective logical-to-physical mappings of row addresses of other memory dies of the plurality of memory dies that are configured with different address scramble patterns.

16. The apparatus of claim 14, wherein:
each of the plurality of memory dies is configured by the address scramble logic to implement a different one of the plurality of address scramble patterns as its respective address scramble pattern.

17. The apparatus of claim 14, wherein each of the plurality of address scramble patterns is unique with respect to others of the plurality of address scramble patterns.

18. The apparatus of claim 14, wherein the address scramble logic is further configured to:
change the first address scramble pattern of the plurality of address scramble patterns by altering at least one bit of a value indicative of the first address scramble pattern in a register of address scramble logic; or
change the second address scramble pattern of the plurality of address scramble patterns by altering at least one bit of a value indicative of the second address scramble pattern in the register of address scramble logic.

19. The apparatus of claim 14, further comprising the memory controller to which the plurality of memory dies are coupled via the interface.

20. The apparatus of claim 14, wherein the apparatus is configured as a dynamic random-access memory (DRAM).

21. The apparatus of claim 14, wherein the apparatus is configured as a Compute Express Link™ (CXL) memory device.

22. The apparatus of claim 21, wherein the CXL memory device is configured as a Type 3 CXL memory device.

23. A method comprising:
receiving, by a memory device comprising a plurality of memory dies, a command to set a first address scramble pattern for a first memory die and a second address scramble pattern of a second memory die of the plurality of memory dies;
monitoring a timer from a previous configuration of address scramble patterns of the first memory die and the second memory die;
migrating, in response to the timer reaching a threshold that enables the memory device to change the address scramble patterns, data from the first memory die and the second memory die to other memory dies of the plurality of memory dies;
setting, based on the command, the first address scramble pattern for the first memory die of the plurality of memory dies, the first address scramble pattern providing a first logical-to-physical mapping for row addresses of the first memory die of the memory device;

setting, based on the command, the second address scramble pattern for the second memory die of the plurality of memory dies, the second address scramble pattern providing a second logical-to-physical mapping for row addresses of the second memory die of the memory device that is different from the first logical-to-physical mapping for row addresses of the first memory die of the memory device;

implementing, for the first memory die of the plurality of memory dies, the first address scramble pattern for the first logical-to-physical mapping of the row addresses in the first memory die of the memory device; and implementing, for the second memory die of the plurality of memory dies, the second address pattern for the second logical-to-physical mapping of the row addresses in the second memory die of the memory device.

24. The method of claim 23, wherein the memory device is configured to implement a plurality of address scramble patterns, each of the plurality of address scramble patterns defining a logical-to-physical conversion of row addresses of a memory die of the memory device that is unique from respective logical-to-physical mappings of row addresses of other memory dies of the memory device that are configured with different ones of the address scramble patterns.

25. The method of claim 23, further comprising configuring each memory die of the plurality of memory dies to implement a unique address scramble pattern.

26. The method of claim 23, further comprising:
flipping or shifting at least one bit of a register value that corresponds to the first address scramble pattern to change the first address scramble pattern of the first memory die to a third address scramble pattern.

27. The method of claim 26, wherein the command is a first command and the method further comprises receiving a second command to change the first address scramble pattern of the first memory die to the third address scramble pattern.

28. The method of claim 27, wherein the first command or the second command is received from a memory controller to which the memory device is coupled.

29. The method of claim 27, wherein the second command indicates to change address scramble patterns for the first memory die and the second memory die of the memory device and the method further comprises flipping or shifting at least one bit of a register value that corresponds to the second address scramble pattern to change the second address scramble pattern of the second memory die to a fourth address scramble pattern.

30. An apparatus comprising:
memory control logic configured to be coupled to a plurality of memory dies of a memory device; and
address scramble logic coupled to the memory control logic and configured to manage respective logical-to-physical address scramble patterns for the plurality of memory dies by:
monitoring a timer from a previous configuration of address scramble patterns of the plurality of memory dies;
migrating, in response to the timer reaching a threshold that enables the address scramble logic to change the address scramble patterns of the memory device, data from a first memory die and a second memory die of the plurality of memory dies to other memory dies of the plurality of memory dies;
determining, after the data has been migrated from the first memory die and the second memory die, to change respective address scramble patterns of the first memory die and the second memory die of the plurality of memory dies of the memory device;
directing the first memory die of the memory device to use a first address scramble pattern, the first address scramble pattern providing a first logical-to-physical mapping for row addresses of the first memory die of the memory device; and
directing the second memory die of the memory device to use a second address scramble pattern, the second address scramble pattern providing a second logical-to-physical mapping for row addresses of the second memory die of the memory device that is different from the first logical-to-physical mapping for row addresses of the first memory die of the memory device.

31. The apparatus of claim 30, wherein the address scramble logic determines to change the respective address scramble patterns of the first memory die and the second memory die of the memory device based on an event that indicates the respective address scramble patterns are in a configurable state.

32. The apparatus of claim 31, wherein the event includes at least one of a power reset event, a power-on event, or an indication that data stored on the memory device is invalid, not current, flushable, or erasable.

33. The apparatus of claim 30, wherein the directing the first memory die or the second memory die of the memory device to use the first address scramble pattern or the second address scramble pattern comprises shifting at least one bit of a register value that corresponds to the respective address scramble pattern of the first memory die or the second memory die of the memory device.

34. The apparatus of claim 30, wherein the address scramble logic is configured to implement a plurality of address scramble patterns for the plurality of memory dies of the memory device and each respective address scramble pattern of the plurality of address scramble patterns is associated with a single memory die of the plurality of memory dies of the memory device.

35. The apparatus of claim 34, wherein the first address scramble pattern and the second address scramble patterns are unique with respect to others of the plurality of address scramble patterns implemented by the memory controller.

36. An apparatus comprising:
a processor;
a memory controller coupled to the processor;
a memory device coupled to the memory controller and comprising a plurality of memory dies;
a timer with a threshold configured to enable the memory controller to change address scramble patterns of the plurality of memory dies; and
address scramble logic coupled to the memory device and configured to:
monitor the timer from a previous configuration of the address scramble patterns of the plurality of memory dies;
migrate, in response to the timer reaching the threshold, data from a first memory die and a second memory die of the plurality of memory dies to other memory dies of the plurality of memory dies;
select from a plurality of address scramble patterns implemented by the address scramble logic, a first address scramble pattern for the first memory die of the plurality of memory dies, the first address scramble pattern providing a first logical-to-physical mapping for row addresses of the first memory die of the apparatus;

select, from the plurality of address scramble patterns implemented by the address scramble logic, a second address scramble pattern for the second memory die of the plurality of memory dies, the second address scramble pattern providing a second logical-to-physical mapping for row addresses of the second memory die of the apparatus that is different from the first logical-to-physical mapping for row addresses of the first memory die of the memory device;

direct the first memory die of the memory device to use the first address scramble pattern for logical-to-physical mapping of the row addresses associated with access of the first memory die of the memory device; and direct the second memory die of the memory device to use the second address scramble pattern for logical-to-physical mapping of the row addresses associated with access of the second memory die of the memory device.

37. The apparatus of claim 36, wherein each of the plurality of address scramble patterns defines a respective logical-to-physical conversion of rows of one of the plurality of memory dies.

38. The apparatus of claim 36, wherein each of the plurality of address scramble patterns is associated with one of the plurality of memory dies of the memory device.

39. The apparatus of claim 36, wherein each address scramble pattern of the plurality of address scramble patterns is unique with respect to others of the plurality of address scramble patterns.

40. The apparatus of claim 39, wherein each of the plurality of address scramble patterns is associated with a single one of the plurality of memory dies.

41. The apparatus of claim 36, wherein the memory device is configured to change the respective address scramble pattern of the first memory die or the second memory die based on a power reset event, a power-on event, or a notification that data stored on the memory device is invalid, not current, flushable, or erasable.

42. The apparatus of claim 36, wherein the memory controller is configured to change the respective address scramble pattern of the first memory die or the second memory die by randomly shifting at least one bit of a register value that corresponds to the first address scramble pattern or the second address scramble pattern.

* * * * *